(12) United States Patent
Paul et al.

(10) Patent No.: US 12,113,069 B2
(45) Date of Patent: Oct. 8, 2024

(54) THERMAL EXTRACTION OF SINGLE LAYER TRANSFER INTEGRATED CIRCUITS

(71) Applicant: Murata Manufacturing Co., Ltd., Kyoto (JP)

(72) Inventors: Abhijeet Paul, Poway, CA (US); Richard James Dowling, Temecula, CA (US); Hiroshi Yamada, San Diego, CA (US); Alain Duvallet, San Diego, CA (US); Ronald Eugene Reedy, San Diego, CA (US)

(73) Assignee: Murata Manufacturing Co., Ltd., Kyoto (JP)

( * ) Notice: Subject to any disclaimer, the term of this patent is extended or adjusted under 35 U.S.C. 154(b) by 169 days.

(21) Appl. No.: 17/901,189

(22) Filed: Sep. 1, 2022

(65) Prior Publication Data
US 2023/0072271 A1 Mar. 9, 2023

Related U.S. Application Data

(63) Continuation of application No. 17/123,881, filed on Dec. 16, 2020, now Pat. No. 11,437,404, which is a
(Continued)

(51) Int. Cl.
*H01L 21/00* (2006.01)
*H01L 21/48* (2006.01)
(Continued)

(52) U.S. Cl.
CPC ...... *H01L 27/1203* (2013.01); *H01L 21/4882* (2013.01); *H01L 21/823481* (2013.01);
(Continued)

(58) Field of Classification Search
CPC ............. H01L 27/1203; H01L 21/4882; H01L 21/823481
See application file for complete search history.

(56) References Cited

U.S. PATENT DOCUMENTS

| 5,633,182 A | 5/1997 | Miyawaki et al. |
| 6,747,514 B1 | 6/2004 | Aude |

(Continued)

FOREIGN PATENT DOCUMENTS

| CN | 102473683 | 5/2012 |
| CN | 107039372 | 6/2013 |

(Continued)

OTHER PUBLICATIONS

Meierewert, Klaus, Invitation to Pay Additional Fees and, Where Applicable, Protest Fee received from the EPO dated Jun. 28, 2019 for appln. No. PCT/US2019/021698, 13 pgs.

(Continued)

*Primary Examiner* — Laura M Menz
(74) *Attorney, Agent, or Firm* — JAQUEZ LAND GREENHAUS & McFARLAND LLP; John Land, Esq.

(57) ABSTRACT

A FET IC structure made using a back-side access process that mitigates or eliminates thermal conductivity problems. In some embodiments, electrically-isolated thermal paths are formed adjacent the FET and configured to conduct heat laterally away from the FET to generally orthogonal thermal pathways, and thence to thermal pads externally accessible at the "top" of the completed IC. In some embodiments having a thermally-conductive handle wafer, electrically-isolated thermal paths are formed adjacent a FET and configured to conduct heat laterally away from the FET. Thermal vias are formed sufficiently so as to be in thermal contact with the handle wafer and with the conventional metallization layers of the device superstructure, at least one of which is in thermal contact with the lateral thermal paths. In some embodiments, the lateral thermal paths may use dummy gates configured to conduct heat laterally away from a FET to generally orthogonal thermal pathways.

4 Claims, 12 Drawing Sheets

Related U.S. Application Data continuation of application No. PCT/US2019/041898, filed on Jul. 15, 2019, which is a continuation of application No. 16/040,295, filed on Jul. 19, 2018, now Pat. No. 10,658,386.

(51) Int. Cl.

| | |
|---|---|
| *H01L 21/8234* | (2006.01) |
| *H01L 21/84* | (2006.01) |
| *H01L 23/373* | (2006.01) |
| *H01L 27/092* | (2006.01) |
| *H01L 27/12* | (2006.01) |

(52) U.S. Cl.
  CPC .......... *H01L 21/84* (2013.01); *H01L 23/3735* (2013.01); *H01L 27/092* (2013.01)

(56) References Cited

U.S. PATENT DOCUMENTS

| | | | |
|---|---|---|---|
| 7,180,019 B1 | 2/2007 | Chiou et al. | |
| 7,414,289 B2 | 8/2008 | Wu et al. | |
| 7,910,993 B2 | 3/2011 | Brindle et al. | |
| 8,048,753 B2 | 11/2011 | Zhou et al. | |
| 8,466,054 B2 * | 6/2013 | Stuber | H01L 23/36 |
| | | | 438/599 |
| 9,276,104 B2 * | 3/2016 | Tsunemi | H01L 21/84 |
| 9,385,083 B1 | 7/2016 | Herrault et al. | |
| 9,472,512 B1 | 10/2016 | Toh et al. | |
| 9,530,798 B1 | 12/2016 | Chou et al. | |
| 9,755,029 B1 * | 9/2017 | Goktepeli | H01L 23/481 |
| 9,780,210 B1 | 10/2017 | Goktepeli et al. | |
| 9,837,412 B2 | 12/2017 | Tasbas et al. | |
| 9,837,965 B1 | 12/2017 | Wagh et al. | |
| 9,847,348 B1 | 12/2017 | Abesingha | |
| 9,960,098 B2 | 5/2018 | Olson | |
| 10,319,662 B2 * | 6/2019 | Shrivastava | H01L 27/0886 |
| 10,573,674 B2 | 2/2020 | Paul | |
| 10,580,903 B2 | 3/2020 | Yamada et al. | |
| 10,658,386 B2 * | 5/2020 | Paul | H01L 23/367 |
| 10,672,806 B2 * | 6/2020 | Paul | H01L 27/13 |
| 11,133,338 B2 * | 9/2021 | Paul | H01L 28/60 |
| 11,335,704 B2 * | 5/2022 | Paul | H01L 23/528 |
| 11,437,404 B2 * | 9/2022 | Paul | H01L 27/092 |
| 2002/0125921 A1 | 9/2002 | Ban Wershoven | |
| 2004/0129977 A1 | 7/2004 | Ohkubo et al. | |
| 2004/0135639 A1 | 7/2004 | Maneatis | |
| 2005/0242884 A1 | 11/2005 | Anand | |
| 2006/0006496 A1 | 1/2006 | Harris et al. | |
| 2006/0012006 A1 | 1/2006 | Tung et al. | |
| 2008/0020488 A1 | 1/2008 | Clevenger et al. | |
| 2008/0079037 A1 | 4/2008 | Zhu et al. | |
| 2008/0277778 A1 | 11/2008 | Furman et al. | |
| 2009/0010056 A1 | 1/2009 | Kuo et al. | |
| 2009/0283854 A1 | 11/2009 | Levy et al. | |
| 2010/0127296 A1 | 5/2010 | Hioki et al. | |
| 2010/0155932 A1 | 6/2010 | Gambino et al. | |
| 2010/0244934 A1 | 9/2010 | Botula et al. | |
| 2010/0244964 A1 | 9/2010 | Deguchi et al. | |
| 2010/0329013 A1 | 12/2010 | Shikata et al. | |
| 2011/0001148 A1 | 1/2011 | Sun et al. | |
| 2011/0025422 A1 | 2/2011 | Marra et al. | |
| 2011/0278581 A1 | 11/2011 | Inoue et al. | |
| 2012/0146193 A1 * | 6/2012 | Stuber | H01L 23/3677 |
| | | | 438/584 |
| 2012/0193752 A1 | 8/2012 | Purushothaman et al. | |
| 2013/0037922 A1 | 2/2013 | Arriagada et al. | |
| 2013/0088870 A1 | 4/2013 | Hsu et al. | |
| 2013/0135824 A1 | 5/2013 | Harubeppu et al. | |
| 2013/0187712 A1 | 7/2013 | Cabanillas et al. | |
| 2013/0270678 A1 * | 10/2013 | Rankin | H01L 23/3677 |
| | | | 257/E27.024 |
| 2013/0310114 A1 | 11/2013 | Zohny et al. | |
| 2014/0191322 A1 | 7/2014 | Botula et al. | |
| 2014/0264468 A1 | 9/2014 | Cheng | |
| 2014/0266458 A1 | 9/2014 | Scott et al. | |
| 2014/0342529 A1 | 11/2014 | Goktepeli et al. | |
| 2015/0008570 A1 | 1/2015 | Arai et al. | |
| 2015/0137201 A1 | 5/2015 | Lee | |
| 2015/0206964 A1 * | 7/2015 | Cheng | H01L 23/585 |
| | | | 438/151 |
| 2015/0236650 A1 | 8/2015 | Deo | |
| 2015/0255368 A1 * | 9/2015 | Costa | H01L 23/293 |
| | | | 438/455 |
| 2015/0255370 A1 | 9/2015 | Shiota et al. | |
| 2015/0270806 A1 | 9/2015 | Wagh et al. | |
| 2015/0280655 A1 | 10/2015 | Nobbe et al. | |
| 2015/0319840 A1 | 11/2015 | Sanada et al. | |
| 2016/0027665 A1 | 1/2016 | Li et al. | |
| 2016/0079137 A1 * | 3/2016 | Leipold | H01L 23/293 |
| | | | 438/126 |
| 2016/0141228 A1 | 5/2016 | Leobandung | |
| 2016/0336344 A1 | 11/2016 | Mason et al. | |
| 2016/0336990 A1 | 11/2016 | Petzold et al. | |
| 2016/0379943 A1 | 12/2016 | Mason et al. | |
| 2017/0005111 A1 | 1/2017 | Verma et al. | |
| 2017/0033135 A1 | 2/2017 | Whitefield et al. | |
| 2017/0084531 A1 | 3/2017 | Gu et al. | |
| 2017/0149437 A1 | 5/2017 | Luo et al. | |
| 2017/0170177 A1 | 6/2017 | Tasbas et al. | |
| 2017/0186643 A1 | 6/2017 | Stamper | |
| 2017/0201291 A1 | 7/2017 | Gu et al. | |
| 2017/0271200 A1 | 9/2017 | Costa | |
| 2017/0373026 A1 | 12/2017 | Goktepeli | |
| 2018/0025970 A1 | 1/2018 | Kao et al. | |
| 2018/0053784 A1 | 2/2018 | Cai et al. | |
| 2018/0151487 A1 | 5/2018 | Venugopal et al. | |
| 2018/0158405 A1 | 6/2018 | Agostinelli et al. | |
| 2018/0158822 A1 | 6/2018 | Tasbas et al. | |
| 2018/0226317 A1 * | 8/2018 | Shrivastava | H01L 27/0886 |
| 2018/0240797 A1 | 8/2018 | Yokoyama et al. | |
| 2018/0337043 A1 | 11/2018 | Englekirk et al. | |
| 2018/0337146 A1 | 11/2018 | Englekirk et al. | |
| 2019/0288006 A1 | 9/2019 | Paul et al. | |
| 2019/0288119 A1 * | 9/2019 | Yamada | H01L 29/66484 |
| 2020/0027898 A1 * | 1/2020 | Paul | H01L 21/84 |
| 2020/0027907 A1 * | 1/2020 | Paul | H01L 27/13 |
| 2020/0027908 A1 * | 1/2020 | Paul | H01L 21/84 |
| 2020/0043946 A1 * | 2/2020 | Paul | H01L 27/1203 |
| 2020/0227447 A1 * | 7/2020 | Paul | H01L 27/1207 |
| 2020/0335522 A1 * | 10/2020 | Paul | H01L 23/528 |
| 2021/0217776 A1 * | 7/2021 | Paul | H01L 23/5226 |
| 2022/0230906 A1 * | 7/2022 | Or-Bach | H01L 29/66825 |
| 2023/0072271 A1 * | 3/2023 | Paul | H01L 23/367 |
| 2023/0361135 A1 * | 11/2023 | Paul | H01L 28/60 |

FOREIGN PATENT DOCUMENTS

| | | | | |
|---|---|---|---|---|
| CN | 104081508 | | 10/2014 | |
| CN | 112424929 | | 2/2021 | |
| CN | 112424929 A | * | 2/2021 | ......... H01L 21/4882 |
| DE | 112019003640 T5 | * | 4/2021 | ......... H01L 21/4882 |
| DE | 112019003640 | | 2/2022 | |
| DE | 112019003640 B4 | * | 2/2022 | ......... H01L 21/4882 |
| EP | 1453093 | | 9/2004 | |
| EP | 2814053 | | 12/2014 | |
| EP | 2814053 A1 | * | 12/2014 | ......... H01L 21/768 |
| EP | 2996143 | | 3/2016 | |
| EP | 2996143 A1 | * | 3/2016 | ......... H01L 21/0217 |
| EP | 3203507 | | 8/2017 | |
| JP | 2017174846 | | 9/2017 | |
| WO | 2007120697 | | 10/2007 | |
| WO | 2011008893 | | 1/2011 | |
| WO | 2013118618 | | 8/2013 | |
| WO | WO-2013118618 A1 | * | 8/2013 | ......... H01L 21/768 |
| WO | 2016183146 | | 11/2016 | |
| WO | 2017038403 | | 3/2017 | |
| WO | 2017099871 | | 6/2017 | |
| WO | 2017222726 | | 12/2017 | |
| WO | WO-2017222726 A1 | * | 12/2017 | ......... H01L 23/481 |
| WO | 2018212975 | | 11/2018 | |
| WO | 2018212976 | | 11/2018 | |
| WO | 2019178004 | | 9/2019 | |
| WO | 2020018471 | | 1/2020 | |

(56) References Cited

FOREIGN PATENT DOCUMENTS

| WO | 2020018847 | | 1/2020 | | |
|---|---|---|---|---|---|
| WO | WO-2020018471 | A1 * | 1/2020 | ......... | H01L 21/4882 |
| WO | WO-2020018847 | A1 * | 1/2020 | ....... | H01L 21/76251 |
| WO | 2020028281 | | 2/2020 | | |
| WO | WO-2020028281 | A1 * | 2/2020 | ........... | H01L 23/367 |

OTHER PUBLICATIONS

Le, Thao P., Notice of Allowance received from the USPTO dated Aug. 20, 2019 for U.S. Appl. No. 16/040,390, 14 pgs.
Le, Thao P., Office Action received from the USPTO dated Sep. 13, 2019 for U.S. Appl. No. 16/040,411, 14 pgs.
Wirner, Christoph, International Search Report received from the USPTO dated Oct. 22, 2019 for appln. No. PCT/US2019/041898, 11 pgs.
Topol, et al. "Enabling SOI-based Assembly Technology for Three-Dimensional (3D) Integrated Circuits (ICs)", International Electron Devices Meeting, 2005.
Wirner, Christoph, International Search Report received from the USPTO dated Oct. 28, 2019 for appln. No. PCT/US2019/042486, 14 pgs.
Wirner, Christoph, International Search Report received from the USPTO dated Oct. 31, 2019 for appln. No. PCT/US2019/043994, 16 pgs.
Hoffmann, Niels, International Search Report and Written Opinion received from the EPO dated Oct. 8, 2019 for appln. No. PCT/US2019/021698, 18 pgs.
Abdelaziez, Yasser A., Office Action received from the USPTO dated Dec. 20, 2019 for U.S. Appl. No. 16/243,947, 8 pgs.
Mazumder, Didarul A., Notice of Allowance received from the USPTO dated Nov. 20, 2019 for U.S. Appl. No. 15/920,321, 13 pgs.
Le, Thao P., Notice of Allowance received from the USPTO dated Dec. 18, 2019 for U.S. Appl. No. 16/040,390, 17 pgs.
Le, Thao P., Notice of Allowance received from the USPTO dated Jan. 31, 2020 for U.S. Appl. No. 16/040,411, 23 pgs.
Abdelaziez, Yasser A., Office Action received from the USPTO dated Mar. 9, 2020 for U.S. Appl. No. 16/243,947, 27 pgs.
Huynh, Andy, Office Action received from the USPTO dated Sep. 9, 2019 for U.S. Appl. No. 16/040,295, 5 pgs.
Huynh, Andy, Office Action received from the USPTO dated Oct. 25, 2019 for U.S. Appl. No. 16/040,295, 41 pgs.
Huynh, Andy, Notice of Allowance received from the USPTO dated Apr. 3, 2020 for U.S. Appl. No. 16/040,295, 30 pgs.
Psemi Corporation, Response filed in the USPTO dated Sep. 25, 2019 for U.S. Appl. No. 16/040,295, 5 pgs.
Pssemi Corporation, Response filed in the USPTO dated Jan. 23, 2020 for U.S. Appl. No. 16/040,295, 9 pgs.
Wirner, Christoph, Written Opinion received from the EPO dated Jul. 14, 2020 for appln. No. PCT/US2019/041898, 8 pgs.
Bakvis, John, International Preliminary Report on Patentability received from the EPO dated Oct. 30, 2020 for appln. No. PCT/US2019/041898, 23 pgs.
Le, Thao P., Notice of Allowance received from the USPTO dated May 20, 2021 for U.S. Appl. No. 16/737,776, 12 pgs.
Kim, Tae Hu, English translation of Office Action received from the KIPO dated Jun. 15, 2021 for appln. No. 10-2021-7001019, 5 pgs.
Leitenmeier, Dr., Exam Report received from the German Patent Office dated Jul. 13, 2021 for appln. No. 11-2019-003-640.8.
Gao, et al., English Translation of Office Action received from CNIPA dated Aug. 23, 2021 for appln. No. 202108180229380, 7 pgs.
Korean Patent Office, English Translation of Notice of Allowance dated Sep. 24, 2021 for appln. No. 10-2021-7001019, 3 pgs.
Menz, Laura Mary, Notice of Allowance received from the USPTO dated May 3, 2022 for U.S. Appl. No. 17/123,881, 43 pgs.
Yamada, et al., "Semiconductor-on-Insulator Transistor with Improved Breakdown Characteristics", patent application filed in the USPTO on Mar. 13, 2018, U.S. Appl. No. 15/920,321, 45 pgs.

Inoussa, Mouloucoulay, Office Action received from the USPTO dated Sep. 22, 2016 for U.S. Appl. No. 14/964,412, 7 pgs.
Inoussa, Mouloucoulay, Office Action received from the USPTO dated Dec. 15, 2016 for U.S. Appl. No. 14/964,412, 12 pgs.
Inoussa, Mouloucoulay, Notice of Allowance received from the USPTO dated Dec. 15, 2016 for U.S. Appl. No. 14/964,412, 12 pgs.
Tasbas, et al., Response filed in the USPTO dated Nov. 7, 2016 for U.S. Appl. No. 14/964,412, 5 pgs.
Tasbas, et al., Response filed in the USPTO dated Apr. 13, 2017 for U.S. Appl. No. 14/964,412, 10 pgs.
Tasbas, et al., Response filed in the USPTO dated Sep. 15, 2017 for U.S. Appl. No. 14/964,412, 12 pgs.
Emam, Mostafa, "RF SOI: from Material to ICs—an Innovative Characterization Approach", FD-SOI and RF-SOI Forum, Friday, Feb. 27, 2015, 35 pgs.
Roda, et al., "RF and Linear Performance of Commercial 200 mm Trap-Rich HR-SOI Wafers for SoC Applications", SIRF 2013, IEEE 2013, pp. 15-17.
Iperione, Analia, International Search Report and Written Opinion received from the EPO dated Dec. 14, 2016 for appln. No. PCT/US2016/054982, 16 pgs.
Botula, et al., "A Thin-film SOI 180nm CMOS RF Switch Technology", IBM Microelectronics, IEEE 2009, 9 pgs.
Sekar, et al., "Comparison of Substrate Effects in Sapphire, Trap-Rich and High Resistivity Silicon Substrates for RF-SOI Applications", IEEE 2015, pp. 37-39.
Neve, et al., "RF and Linear Performance of Commercial 200 mm trap-rich HR-SOI Wafers for SoC Applications", IEEE 2013, pp. 15-17.
Kerr, et al., "Identification of RF Harmonic Distortion on Si Substrates and its Reduction using a Trap-Rich Layer", IEEE 2008, pp. 151-154.
Peregrine Semiconductor Corporation, Response and English translation filed in the TIPO dated Apr. 25, 2017 for appln. No. 105131544, 17 pgs.
Peregrine Semconductor Corporation, Request for Substantive Examination and Voluntary Amendment filed in the SIPO for appln. No. 201610885245.6, 7 pgs.
Peregrine Semiconductor Corporation, Demand and Amendment filed in the EPO dated Jun. 28, 2017 for appln. No. PCT/US2016/054982, 24 pgs.
Mazumder, Didarul A., Office Action received from the USPTO dated Feb. 11, 2019 for U.S. Appl. No. 15/920,321, 20 pgs.
Le, Dung Anh, Office Action received from the USPTO dated Dec. 29, 2016 for U.S. Appl. No. 15/194,114, 14 pgs.
Le, Dung Anh, Office Action received from the USPTO dated Jun. 23, 2017 for U.S. Appl. No. 15/194,114, 10 pgs.
Le, Dung Anh, Notice of Allowance received from the USPTO dated Dec. 1, 2017 for U.S. Appl. No. 15/194,114, 5 pgs.
Olson, Chris, Response filed in the USPTO dated Sep. 18, 2017 for U.S. Appl. No. 15/194,114, 9 pgs.
Olson, Chris, Response filed in the USPTO dated Mar. 28, 2017 for U.S. Appl. No. 15/194,114, 9 pgs.
Luu, Chuong A., Office Action received from the USPTO dated Jan. 4, 2018 for U.S. Appl. No. 15/600,588, 7 pgs.
Luu, Chuong A., Office Action received from the USPTO dated Feb. 9, 2018 for U.S. Appl. No. 15/600,588, 15 pgs.
Luu, Chuong A., Office Action received from the USPTO dated Jun. 1, 2018 for U.S. Appl. No. 15/600,588, 13 pgs.
Luu, Chuong A., Office Action received from the USPTO dated Nov. 8, 2018 for U.S. Appl. No. 15/600,588, 16 pgs.
Englekirk, et al., Response filed in the USPTO dated Jan. 10, 2018 for U.S. Appl. No. 15/600,588, 8 pgs.
Englekirk, et al., Response filed in the USPTO dated Feb. 26, 2018 for U.S. Appl. No. 15/600,588, 8 pgs.
Englekirk, et al., Response filed in the USPTO dated Jul. 16, 2018 for U.S. Appl. No. 15/600,588, 4 pgs.
Englekirk, et al., Response filed in the USPTO dated Nov. 9, 2018 for U.S. Appl. No. 15/600,588, 6 pgs.
Inoussa, Mouloucoulay, Final Office Action received from the USPTO dated Jul. 18, 2017 for U.S. Appl. No. 14/964,412, 16 pgs.
Hoffmann, Niels, Written Opinion received from the EPO dated Nov. 27, 2017 for appln. No. PCT/US2016/054982, 9 pgs.

(56) References Cited

OTHER PUBLICATIONS

Inoussa, Mouloucoulay, Office Action received from the USPTO dated Mar. 26, 2018 for U.S. Appl. No. 15/488,367, 21 pgs.
Hoffmann, Niels, International Preliminary Report on Patentability received from the EPO dated Mar. 29, 2018 for appln. No. PCT/US2016/054982, 20 pgs.
Psemi Corporation, Response filed in the USPTO dated May 3, 2018 for U.S. Appl. No. 15/488,367, 16 pgs.
Inoussa, Mouloucoulay, Office Action received from the USPTO dated May 29, 2018 for U.S. Appl. No. 15/824,990, 7 pgs.
Juhl, Andreas, International Search Report and Written Opinion received from the EPO dated Aug. 2, 2018 for appln. No. PCT/US2018/030191, 13 pgs.
Inoussa, Mouloucoulay, Office Action received from the USPTO dated Aug. 30, 2018 for U.S. Appl. No. 15/824,990, 21 pgs.
Paul, et al., "High-Q Integrated Circuit Inductor Structure and Methods", application filed in the USPTO on Jul. 19, 2018, U.S. Appl. No. 16/040,411, 43 pgs.
Paul, et al., "SLT Integrated Circuit Capacitor Structure and Methods", application filed in the USPTO on Jul. 19, 2018, U.S. Appl. No. 16/040,390, 43 pgs.
Le, Thao P., Office Action received from the USPTO dated Mar. 22, 2019 for U.S. Appl. No. 16/040,390, 11 pgs.
Le, Thao P., Office Action received from the USPTO dated Apr. 4, 2019 for U.S. Appl. No. 16/040,411, 6 pgs.
Mazumder, Didarul A., Final Office Action received from the USPTO dated Jun. 5, 2019 for U.S. Appl. No. 15/920,321, 31 pgs.
Le, Thao P., Notice of Allowance received from the USPTO dated Jun. 5, 2019 for U.S. Appl. No. 16/040,390, 7 pgs.
Le, Thao P., Office Action received from the USPTO dated Jun. 14, 2019 for U.S. Appl. No. 16/040,411, 5 pgs.

* cited by examiner

*800*

```
┌─────────────────────────────────────┐
│ Fabricating at least one laterally-extending │
│ thermal path having a near portion in close │
│ thermal contact with the transistor device, and a │
│ far portion sufficiently spaced away from the │
│ transistor device in a lateral direction from the │── 802
│ transistor device so as to be couplable to a │
│ generally orthogonal thermal pathway, each │
│ laterally-extending thermal path being │
│ substantially electrically isolated from the │
│ transistor device │
└─────────────────────────────────────┘
                   │
                   ▼
┌─────────────────────────────────────┐
│ Fabricating at least one generally orthogonal │
│ thermal pathway thermally coupled to at least │
│ one laterally-extending thermal path and │
│ configured to convey heat from the at least one │── 804
│ laterally-extending thermal path to at least one │
│ of (i) the at least one externally accessible │
│ thermal pad, or (ii) the handle wafer │
└─────────────────────────────────────┘
```

FIG. 8

THERMAL EXTRACTION OF SINGLE LAYER TRANSFER INTEGRATED CIRCUITS

CROSS-REFERENCE TO RELATED APPLICATIONS AND CLAIM OF PRIORITY

The present application is a continuation of U.S. patent application Ser. No. 17/123,881 filed Dec. 16, 2020, to issue on Sep. 6, 2022 as U.S. Pat. No. 11,437,404, which in turn is a a continuation of International Patent Application No. PCT/US2019/041898 filed on Jul. 15, 2019, which in turn is a continuation of U.S. Non-Provisional application Ser. No. 16/040,295, filed on Jul. 19, 2018 for "Thermal Extraction of Single Layer Transfer Integrated Circuits", issued as U.S. Pat. No. 10,658,386 on May 19, 2020, the disclosures of which are incorporated herein by reference in their entirety.

The present application may be related to the following patents and patent applications, the contents of all of which are incorporated herein by reference in their entirety:

- U.S. patent application Ser. No. 15/920,321, filed Mar. 13, 2018, entitled "Semiconductor-on-Insulator Transistor with Improved Breakdown Characteristics";
- U.S. Pat. No. 9,837,412, issued Dec. 5, 2017, entitled "S-Contact for SOI";
- U.S. Pat. No. 9,960,098, issued May 1, 2018, entitled "Systems and Methods for Thermal Conduction Using S-Contacts";
- U.S. Pat. No. 10,276,371, issued Apr. 30, 2019, entitled "Managed Substrate Effects for Stabilized SOI FETs";
- Co-pending U.S. patent application Ser. No. 16/040,411, filed Jul. 19, 2018, entitled "High-Q Integrated Circuit Inductor Structure and Methods"; and
- Co-pending U.S. patent application Ser. No. 16/040,390, filed Jul. 19, 2018, entitled "SLT Integrated Circuit Capacitor Structure and Methods".

BACKGROUND

(1) Technical Field

This invention relates to electronic integrated circuits, and more particularly to electronic integrated circuits having transistors fabricated with semiconductor-on-insulator technology.

(2) Background

Virtually all modern electronic products—including laptop computers, mobile telephones, and electric cars—utilize complementary metal oxide semiconductor (CMOS) transistor integrated circuits (ICs), and in many cases CMOS ICs fabricated using a semiconductor-on-insulator process, such as silicon-on-insulator (SOI) or germanium-on-insulator. SOI transistors in which the electrical insulator is aluminum oxide (i.e., sapphire) are called silicon-on-sapphire or "SOS" devices. Another example of a semiconductor-on-insulator technology is "silicon-on-glass", and other examples are known to those of ordinary skill in the art.

Taking SOI as one example of semiconductor-on-insulator, SOI technology encompasses the use of a layered silicon-insulator-silicon substrate in place of conventional "bulk" silicon substrates in semiconductor manufacturing. More specifically, SOI transistors are generally fabricated on a layer of silicon dioxide, $SiO_2$ (often called a "buried oxide" or "BOX" layer) formed on a bulk silicon substrate. The BOX layer reduces certain parasitic effects typical of bulk silicon CMOS processes, thereby improving performance. SOI-based devices thus differ from conventional bulk silicon devices in that the silicon regions of the CMOS transistors are fabricated on an electrical insulator (typically silicon dioxide or aluminum oxide) rather than on a bulk silicon substrate.

As a specific example of a semiconductor on insulator process for fabricating ICs, FIG. 1A is a stylized cross-sectional view of a typical prior art SOI IC structure 100 for a single metal-oxide-semiconductor (MOS) field effect transistor (FET), or MOSFET. The SOI structure 100 includes a substrate 102, a buried-oxide (BOX) insulator layer 104, and an active layer 106 (note that the dimensions for the elements of the SOI IC structure 100 are not to scale; some dimensions have been exaggerated for clarity or emphasis). The substrate 102 is typically a semiconductor material such as silicon. The BOX layer 104 is a dielectric, and is often $SiO_2$ formed as a "top" surface 102T of the silicon substrate 102, such as by oxidation, layer transfer, or implantation. The active layer 106 may include some combination of implants and/or layers that include dopants, dielectrics, polysilicon, metal wiring, passivation, and other materials to form active and/or passive electronic components and/or mechanical structures. For example, in the illustrated embodiment, a FET (encircled by a dashed oval 108) is shown, with the FET 108 comprising a source S, a drain D, and a primary gate G atop an insulating gate oxide (GOX) layer 110. A body B is defined below the primary gate G, between the source S and the drain D. In typical operation (e.g., an enhancement-mode MOSFET), a "conduction channel" (also called an "inversion channel") is generated within the body B between the source S and the drain D and proximate the GOX layer 110 (e.g., within about the top 100 Å of the body B). A body contact (not shown), which generally comprises a region with the same doping as the body B, may be resistively coupled to the body B through an extension of the semiconductor island typically extending in the width direction of the transistor (in FIG. 1A, that would be in/out of the plane of the image) to provide a fourth terminal to the FET 108. As is known, the body contact is commonly coupled to a bias node such as a power supply, to circuit ground, or to the source S (although other connection nodes are possible). If an SOI transistor has a body contact, it is known as body-contacted transistor, otherwise it is known as a floating-body transistor.

If the source S and drain D are highly doped with N type material, the FET is an N-type FET, or NMOS device. Conversely, if the source S and drain D are highly doped with P type material, the FET is a P-type FET, or PMOS device. Thus, the source S and drain D doping type determines whether a FET is an N-type or a P-type. CMOS devices comprise N-type and P-type FETs co-fabricated on a single IC die, in known fashion. The gate G is typically formed from polysilicon.

A superstructure 112 of various elements, regions, and structures may be fabricated in known fashion above the FET 108 in order to implement particularly functionality. The superstructure 112 may include, for example, conductive interconnections from the illustrated FET 108 to other components (including other FETs) and/or external contacts, passivation layers and regions, and protective coatings. The conductive interconnections may be, for example, copper or other suitable metal or electrically conductive material.

For example, FIG. 1B is a stylized cross-sectional view of a typical prior art SOI IC structure 120 for a single FET, showing details of the superstructure 112. In this example, the superstructure 112 includes conductive (e.g., metal) interconnect levels M1 (closest to the FET 108), M2, M3, M4, and M5 (in this example, the "top metal"), separated in places by insulating and/or passivation layers or regions (generally indicated as "oxide", but other materials may be used); as is known in the art, more or fewer than five interconnect levels may be used. The M5 layer may be covered in whole or in part by another conductive material (commonly aluminum) to form what is commonly known as a "redistribution layer", or RDL, shown in FIG. 1B as within a sub-portion 112' of the superstructure 112. Top-side RDLs are generally added near the end of or even after the CMOS fabrication process and are often of much thicker and wider dimensions than the CMOS metallization (e.g., M1-M5 layers). Top-side RDLs are often used to distribute high current power around an IC chip or to render high-Q inductors (and sometimes capacitors) for RF circuits. As can be seen in FIG. 1B, top-side RDLs are often connected to the M5 layer of the IC for subsequent packaging. An aluminum layer may also be used as a capping layer over final copper metal structures, which generally cannot be left exposed in order to avoid oxidation of the copper. Thus, an aluminum layer may be both an RDL and a capping layer.

Other elements, regions, and structures may be included for particular circuit designs. For example, referring to FIG. 1A, conductive substrate contact (S-contacts) (shown as the structure "SC") may be formed from the superstructure 112 through the active layer 106 to the BOX layer 104 or to conductive regions or wells formed in and/or above the BOX layer 104. S-contacts may be used, for example, to mitigate accumulated charge effects that adversely affect the FET, for shielding, and/or for thermal conduction. Examples of applications of S-contacts are set forth in U.S. Pat. No. 9,837,412, issued Dec. 5, 2017, entitled "S-Contact for SOI", in U.S. patent application Ser. No. 15/194,114, filed Jun. 27, 2016, entitled "Systems and Methods for Thermal Conduction Using S-Contacts", and in U.S. patent application Ser. No. 15/600,588, filed May 19, 2017, entitled "Managed Substrate Effects for Stabilized SOI FETs", all of which are hereby incorporated by reference.

As should be appreciated by one of ordinary skill in the art, a single IC die may embody from one electronic component—such as FET 108—to millions of electronic components. Further, the various elements of the superstructure 112 may extend in three-dimensions and have quite complex shapes. In general, the details of the superstructure 112 will vary from IC design to IC design.

The BOX layer 104, while enabling many beneficial characteristics for SOI IC's, also introduces some problems, such as capacitive coupling to the substrate 102, a thermal barrier to heat flow, and a voltage breakdown path to the substrate 102. Capacitive coupling with the substrate 102 alone can cause numerous side effects compared to an ideal SOI transistor, such as increased leakage current, lower breakdown voltage, signal cross-coupling, and linearity degradation. However, the most serious capacitive coupling effect caused by the BOX layer 104 is often the "back-channel" effect.

Referring back to FIG. 1A, the structure of a secondary parasitic back-channel FET (shown in a dashed square 120) is formed by the source S, the drain D, the BOX layer 104 (functioning as a gate insulator), and the substrate 102 (effectively functioning as a secondary gate). FIG. 1C is an equivalent schematic diagram of the FET structure shown in FIG. 1A, showing how the secondary parasitic back-channel FET 120 is coupled in parallel with the primary FET 108. Notably, the voltages and charge accumulations in and around the secondary gate (i.e., the substrate 102) may vary and in general are not well controlled. Accordingly, as is widely known, the presence of the secondary parasitic back-channel FET 120 adjacent the FET 108 can place the bottom of the FET 108 in uncontrolled states, often in a subthreshold leakage regime, which in turn may create uncontrollable source-drain leakage currents.

It is possible to mitigate some of the side effects of the secondary parasitic back-channel FET 120. One known mitigating technique utilizes "single layer transfer", or SLT, as part of the IC fabrication process. The SLT process essentially flips an entire SOI transistor structure upside down onto a "handle wafer", with the original substrate (e.g., substrate 102 in FIG. 1A) then being removed, thereby eliminating the substrate 102. For example, FIG. 2 is a stylized cross-sectional view of a typical prior art SOI IC structure 100 for a single FET, fabricated using an SLT process. Essentially, after most or all of the superstructure 112 of FIGS. 1A and 1B is completed, a first passivation layer 202 (e.g., $SiO_2$) is generally applied on top of the superstructure 112, and then the original substrate 102 and the layers denoted as "X" in FIG. 1A are flipped over and attached or bonded in known fashion to a handle wafer 204, as shown in FIG. 2. The handle wafer 204 is typically silicon with a bonding layer of $SiO_2$ (e.g., thermally grown oxide) on the surface facing the first passivation layer 202. Thereafter, the original substrate 102 is removed (e.g., by mechanical and/or chemical means), thus exposing the BOX layer 104. A non-conductive second passivation layer 206, which may be a conventional interlayer dielectric (ILD) material, may be formed on the exposed BOX layer 104.

In the structure of FIG. 2, the portions of the FET 108 formerly closest to the original substrate 102 are now found near the "new top" of the IC structure, farthest away from the handle wafer 204. Conversely, those portions of the FET 108 formerly farthest away from the original substrate 102 are now found in the interior of the IC structure, situated closest to the handle wafer 204. Consequently, the gate G (and thus connections to the gate) of the FET 108 is now oriented towards the handle wafer 204, and the BOX layer 104 in the structure of FIGS. 1A and 1B—previously adjacent to the original substrate 102—is now very close to the "new top" of the IC structure.

Although not exactly to scale, the BOX layer 104 in FIG. 1A exhibits relatively high capacitive coupling to the original substrate 102, causing the above-mentioned side effects. Referring to FIG. 2, while the BOX layer 104 is still present with the inverted IC structure, the "backside" of the FET 108 is now near the "new top" of the IC structure, but with no adjacent semiconductive "backside gate" material (i.e., the original substrate 102).

While the IC structure of FIG. 2 may be preferred to the closely coupled substrate IC structure of FIG. 1A, where the original substrate 102 serves as a gate for the secondary parasitic back-channel FET 120, the electrical characteristics of the regions of the FET 108 adjacent the BOX layer 104 are still not well controlled. Further, while SOI FETs have been used in the examples above, similar problems exist in other semiconductor-on-insulator technologies.

The problems caused by the secondary parasitic back-channel FET of conventional FET IC structures are mitigated or eliminated by the structures and methods taught in co-pending and commonly owned U.S. patent application Ser. No. 15/920,321, referenced above. Embodiments of that invention enable full control of the secondary parasitic back-channel FET of semiconductor-on-insulator IC primary FETs by fabricating such ICs using a process which allows access to the backside of the FET, such as an SLT process (collectively, a "back-side access process"). Thereafter, a conductive aligned supplemental (CAS) gate structure is fabricated relative to the BOX layer and juxtaposed to a primary FET such that a control voltage applied to the CAS gate can regulate the electrical characteristics of the regions of the primary FET adjacent the BOX layer. Such a FET may also be referred to as a "CAS-gated FET".

While the disclosure in U.S. patent application Ser. No. 15/920,321 mitigates or eliminates the problems caused by the secondary parasitic back-channel FET of conventional FET IC structures, in some cases, some embodiments exhibit poor thermal conductivity, which can cause reliability, performance, and other problems in an IC. The problem of poor thermal conductivity thus also applies generally to ICs made by a back-side access process, such as the SLT process.

Accordingly, there is a need for a FET IC structure made using a back-side access process that mitigates or eliminates thermal conductivity problems arising from such structures. The present invention addresses these needs and more.

SUMMARY

The present invention encompasses an FET IC structure made using a back-side access process that mitigates or eliminates thermal conductivity problems arising from such structures.

In some embodiments of the invention, during fabrication of a FET made using a back-side access process, one or more electrically-isolated thermal paths are formed adjacent the FET and configured to conduct heat laterally away (e.g., "horizontally") from the FET to generally orthogonal (e.g., "vertical") thermal pathways (e.g., vias or other heat pipes), and thence to corresponding thermal pads externally accessible at the "top" of the completed integrated circuit (IC).

In some embodiments of the invention that utilize a thermally-conductive handle wafer, during fabrication of a FET made using a back-side access process, one or more electrically-isolated thermal paths are formed adjacent a FET and configured to conduct heat laterally away from the FET. Thermal vias or pathways are formed sufficiently through a separating passivation layer so as to be in thermal contact with the handle wafer and with the conventional metallization layers of the device superstructure, at least one of which is in thermal contact with the lateral thermal paths. Accordingly, heat is conducted from the FET through the lateral thermal paths, then through the metallization layers and thermal vias to the thermally-conductive handle wafer, and thus to the "bottom" or "backside" of the completed integrated circuit (IC), which may be placed in thermal contact with a heat sink.

In some embodiments, the lateral thermal paths may use dummy gates specially configured to conduct heat laterally away from a FET to generally orthogonal thermal pathways or interconnection metallization structures.

The details of one or more embodiments of the invention are set forth in the accompanying drawings and the description below. Other features, objects, and advantages of the invention will be apparent from the description and drawings, and from the claims.

DESCRIPTION OF THE DRAWINGS

FIG. 8 is a process flow chart showing one method for making a thermal conduction structure a thermal conduction structure for an integrated circuit transistor device made using a back-side access process and mounted on a handle wafer such that a gate of the transistor device is oriented towards the handle wafer.

Like reference numbers and designations in the various drawings indicate like elements.

DETAILED DESCRIPTION

The present invention encompasses an FET IC structure made using a back-side access process that mitigates or eliminates thermal conductivity problems arising from such structures. Embodiments of the invention are applicable to conductive aligned supplemental (CAS) FET IC structures made in accordance with the teachings of U.S. patent application Ser. No. 15/920,321).

Thermal Conductivity Challenges of CAS-Gated FETs

To better understand the thermal conductivity problems of integrated circuits (ICs) made using a back-side access process (such as an SLT process, and including CAS-gated FET IC structures), it is useful to consider details of how such structures are formed. For convenience, the example below describes a CAS-gated silicon-on-insulator (SOI) FET made using a single layer transfer (SLT) process as one example of a FET made by a back-side access process. While SOI FETs are used in the example below, similar problems exist in other semiconductor-on-insulator technologies.

Figure 1A:
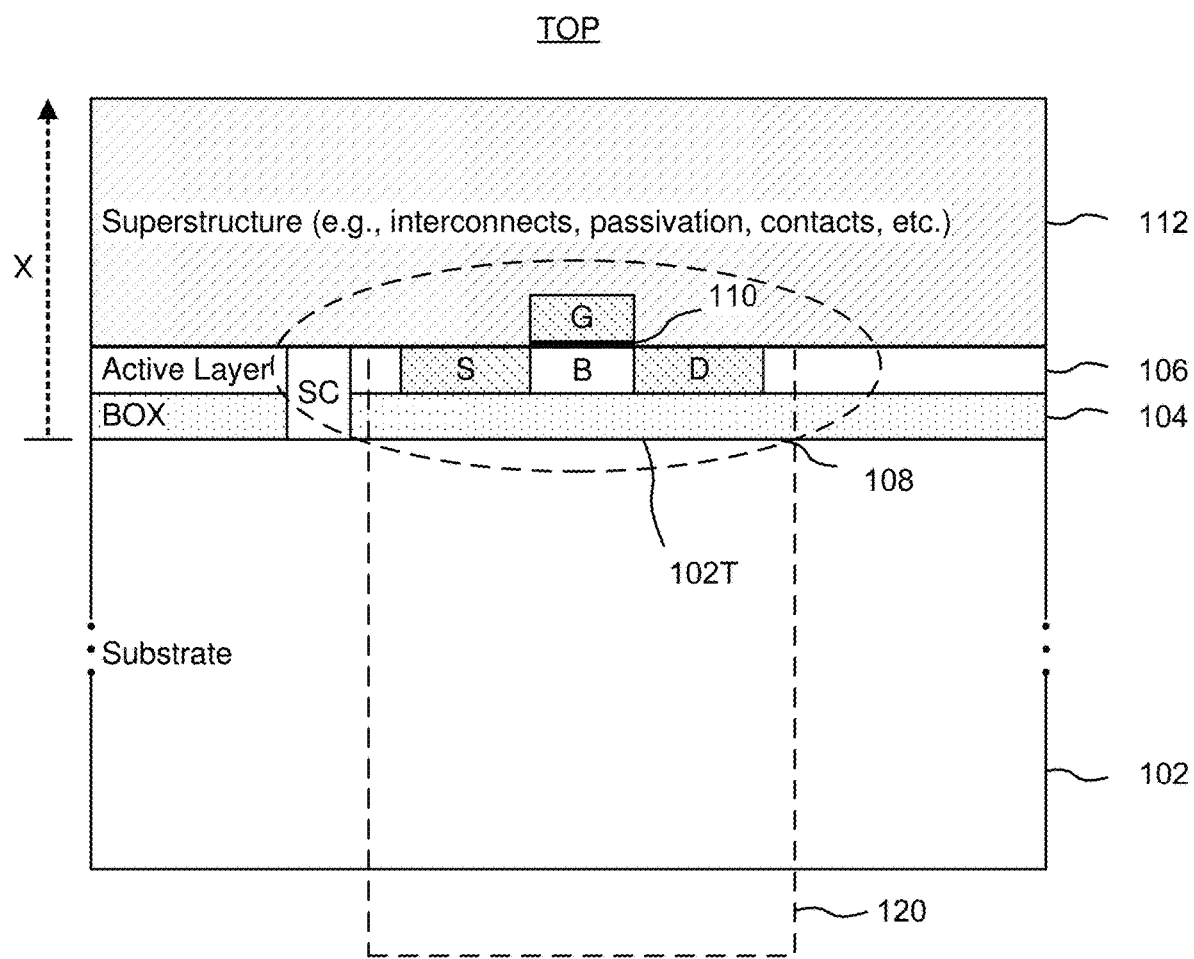
FIG. 1A is a stylized cross-sectional view of a typical prior art SOI IC structure for a single metal-oxide-semiconductor (MOS) field effect transistor (FET).
Figure 1B:
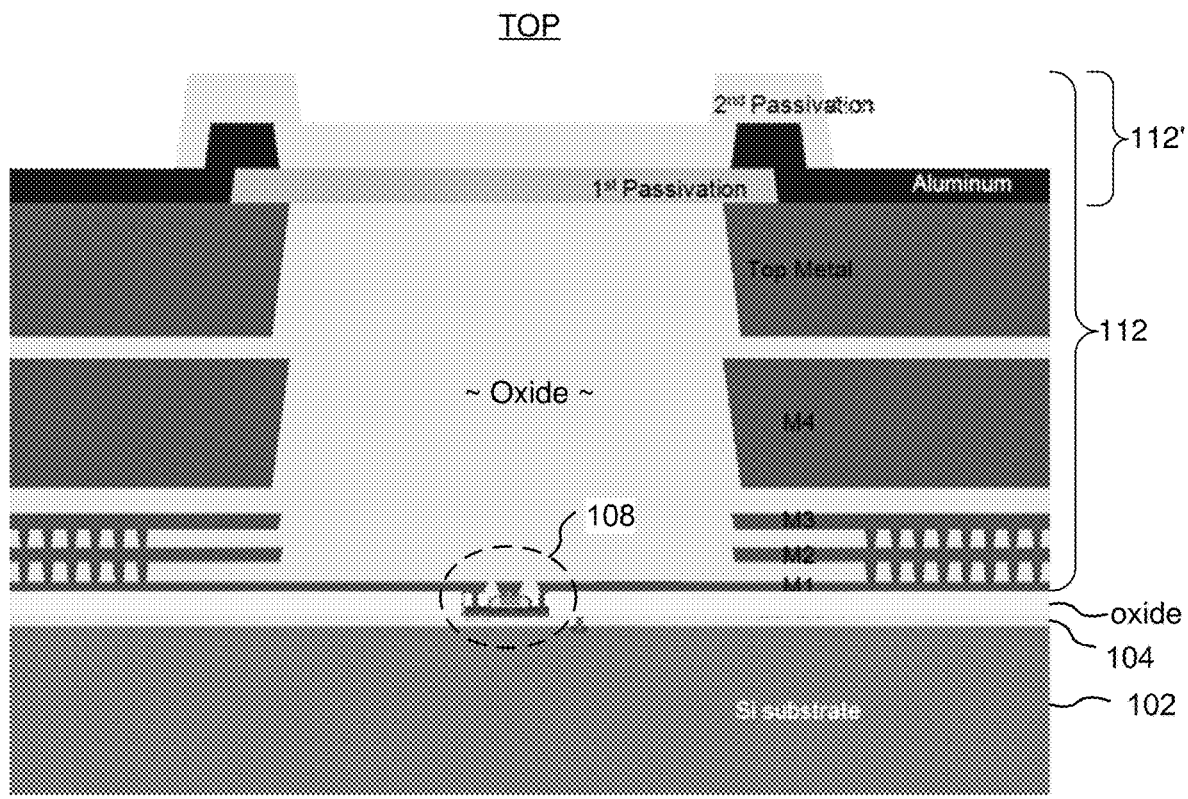
FIG. 1B is a stylized cross-sectional view of a typical prior art SOI IC structure for a single FET, showing details of the superstructure.
Figure 1C:
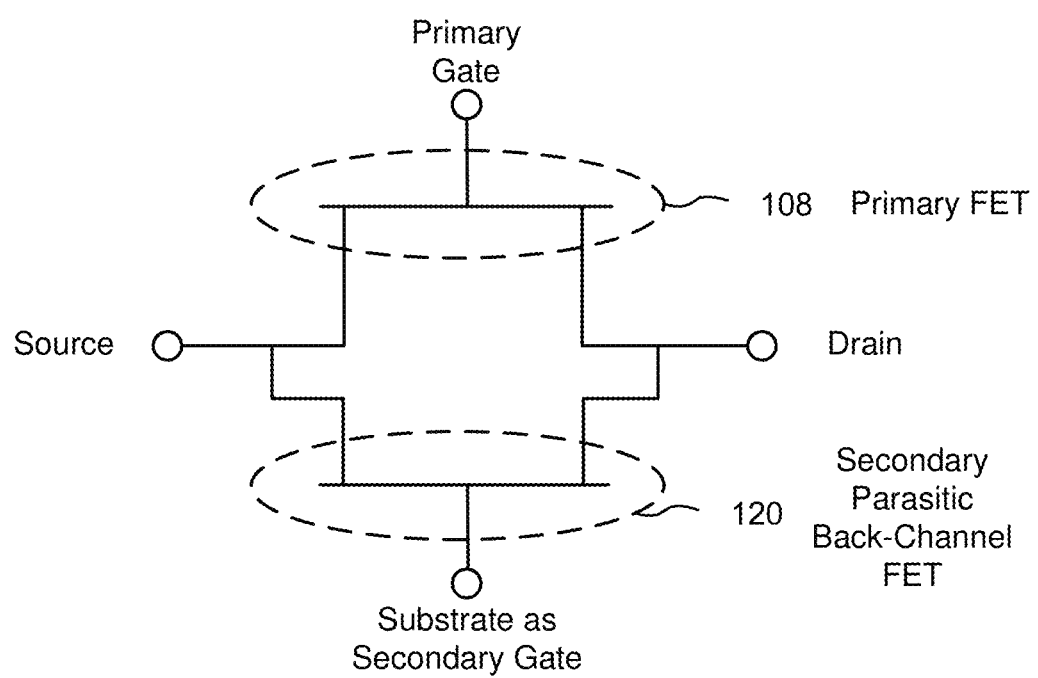
FIG. 1C is an equivalent schematic diagram of the FET structure shown in FIG. 1A, showing how the secondary parasitic back-channel FET is coupled in parallel with the primary FET.
Figure 2:
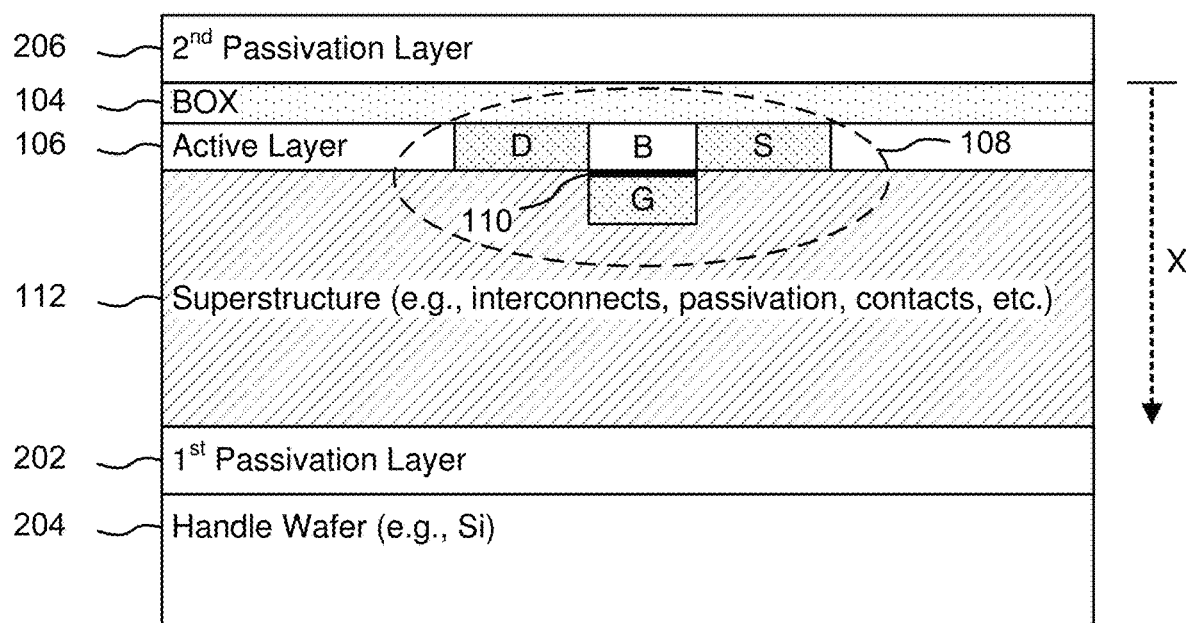
FIG. 2 is a stylized cross-sectional view of a typical prior art SOI IC structure for a single FET, fabricated using an SLT process.
Figure 3A:
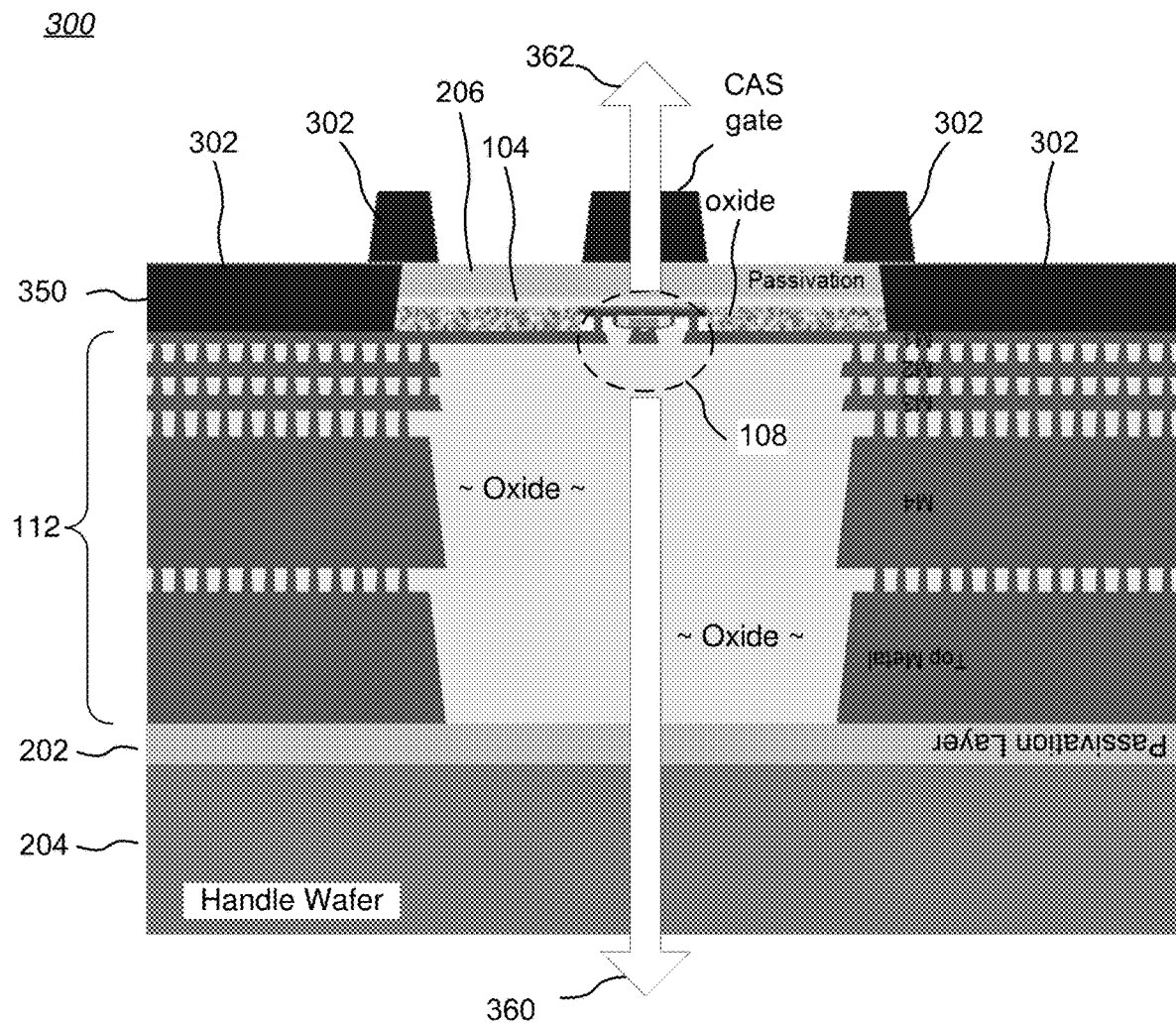
FIG. 3A is a stylized cross-sectional view of an SOI IC structure for a single primary FET, showing a CAS gate formed after application of an SLT process.
Figure 3B:
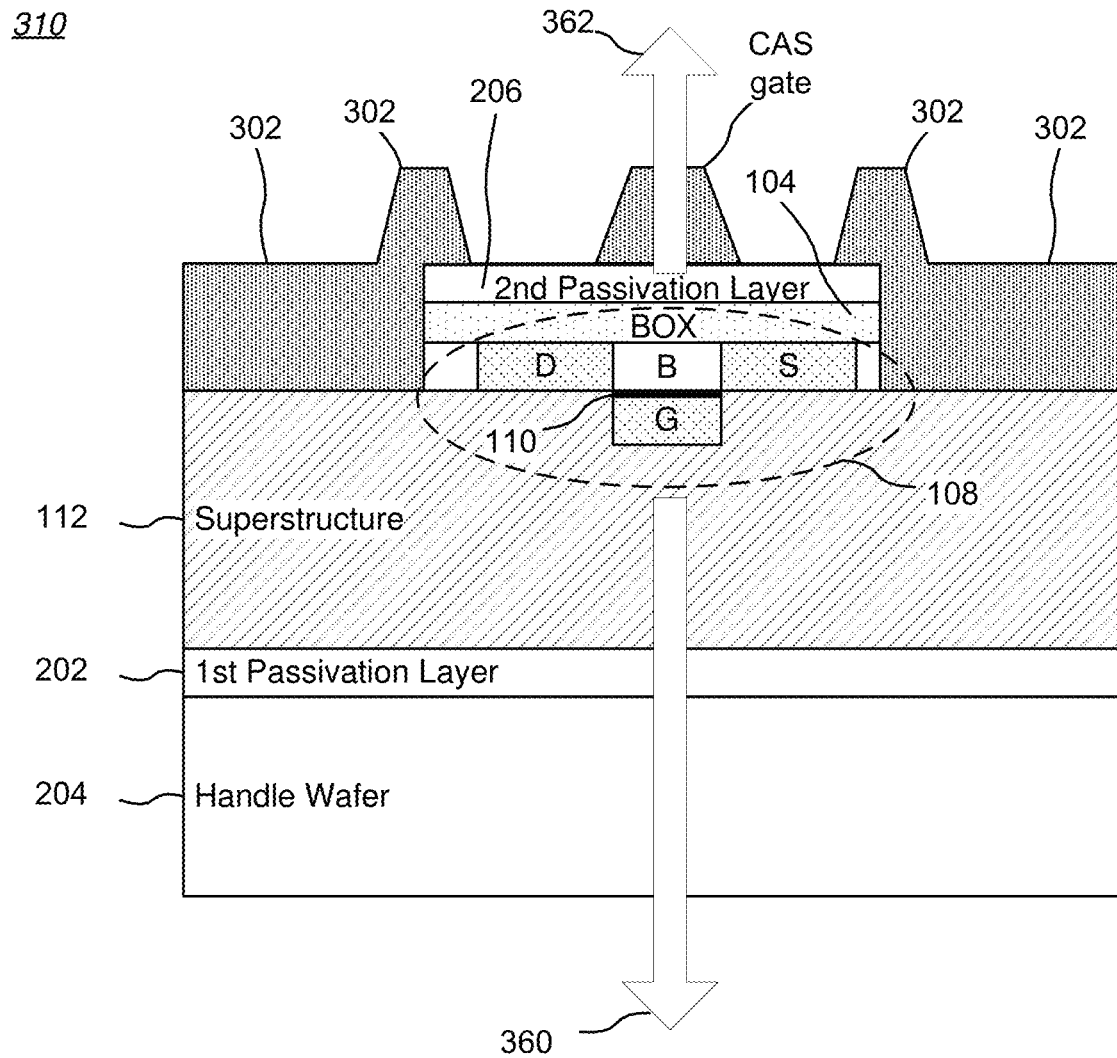
FIG. 3B is a simplified IC structure essentially corresponding to the IC structure of FIG. 3A, redrawn for enhanced clarity of the various structural elements, with the scale of selected elements enlarged relative to other elements for emphasis.

FIG. 3A is a stylized cross-sectional view of an SOI IC structure 300 for a single primary FET 108, showing a CAS gate formed after application of an SLT process. FIG. 3B is a simplified IC structure 310 essentially corresponding to the IC structure 300 of FIG. 3A, redrawn for enhanced clarity of the various structural elements, with the scale of selected elements enlarged relative to other elements for emphasis. The IC structures 300, 310 are in part similar to the SLT wafer of FIG. 2, except that the second passivation layer 206 of FIG. 2 is modified by the creation of a specially aligned and patterned backside contact pattern (BCP) 302, which may be formed, for example, using known redistribution layer (RDL) techniques. The BCP 302 is patterned to define the CAS gate, which is at least partially aligned with a corresponding primary FET 108 adjacent the (former) back-channel of the primary FET 108 and electrically isolated from the rest of the BCP 302. The BCP 302 (and thus the CAS gate) may be formed from aluminum or similar material in the same manner as conventional RDLs are formed on the top-side of the superstructure 112 of non-SLT wafers, such as is shown in FIG. 1B. Note that the new top of the IC structure 300 may be patterned and covered in places with a deposited or formed protective or passivation layer (not shown), which may be, for example, a conventional interlayer dielectric (ILD) material and/or a conventional moisture and contaminant barrier. Further details and examples of how to fabricate such an IC structure are set forth in U.S. patent application Ser. No. 15/920,321.

For the structure shown in FIG. 3A, the passivation layer 202 is a relatively poor thermal conductor. The handle wafer 204 itself is relatively thick—and thus inhibits heat flow—and may be a poor thermal conductor, such as glass. In addition, the superstructure 112 is shown in FIG. 3A as being much thicker than the conductive layer 350 used for the BCP 302. However, the RDL process used to create the BCP 302 often results in the BCP 302 being much thicker than the superstructure 112, and thus an inhibitor of heat flow. The non-conductive second passivation layer 206 (typically SiO$_2$) interposed between the FET 108 and the CAS gate is also relatively thick, in addition to being a relatively poor thermal conductor.

Due to the presence of the heat conduction inhibitors that result from the back-side access (e.g., SLT) and CAS-gate fabrication processes, removing heat from a CAS-gated FET 108 can be difficult, leading to degradations to reliability, performance, and other characteristics. This issue is highlighted in FIG. 3A by considering the FET 108 encircled by a dashed oval. The superstructure 112 includes a significant amount of metallization that, in a conventional FET, would be at the top of the IC and aid in conducting heat away from the FET 108, as shown in FIG. 1B. However, in a FET made by a back-side access process, including a CAS-gated FET structure, the superstructure 112 is butted against the first passivation layer 202. Accordingly, the passivation layer 202 and the handle wafer 204 inhibit conduction of heat (symbolized by an arrow 360) from the FET 108 "downwards" to a heat sink (not shown). In addition, the FET 108 is sandwiched between the superstructure 112 and the combination of the BOX layer 104, the non-conductive second passivation layer 206, and the BCP 302 (for a CAS-gated FET), which inhibit conduction of heat (symbolized by an arrow 362) from the FET 108 "upwards" to a heat sink, such as to open air or a surface-mounted cooling structure (not shown). Moreover, there is no place to put conventional thermal pads to conduct heat away from the FET 108.

The result is that heat generated by the FET 108 does not readily dissipate, which may cause a severe temperature rise when the FET 108 is operated in a high power mode, such as in a power amplifier (PA). Some embodiments of conventional SLT SOI FETs have shown temperature increases of 76%-135% when compared to conventional non-SLT SOI FETs.

Relative Dimensions and Orientations in the Drawings

With respect to the figures referenced in the examples below, note that the dimensions for the various elements are not to scale; some dimensions have been exaggerated vertically and/or horizontally for clarity or emphasis. In addition, references to orientations and directions (e.g., "top", "bottom", "above", "below", "lateral", "orthogonal" etc.) are relative to the example drawings, and not necessarily absolute orientations or directions.

First Example Embodiment

In some embodiments of the invention, during fabrication of a FET made using a back-side access process, one or more electrically-isolated, laterally-extending thermal paths are formed adjacent the FET and configured to conduct heat laterally away (e.g., "horizontally") from the FET to generally orthogonal (e.g., "vertical") thermal pathways (e.g., vias or heat pipes), and thence to corresponding thermal pads externally accessible at the "top" of the completed integrated circuit (IC). Such a "top side" thermal extraction configuration is particularly useful for ICs mounted in a "flip-chip" package.

Figure 4A:
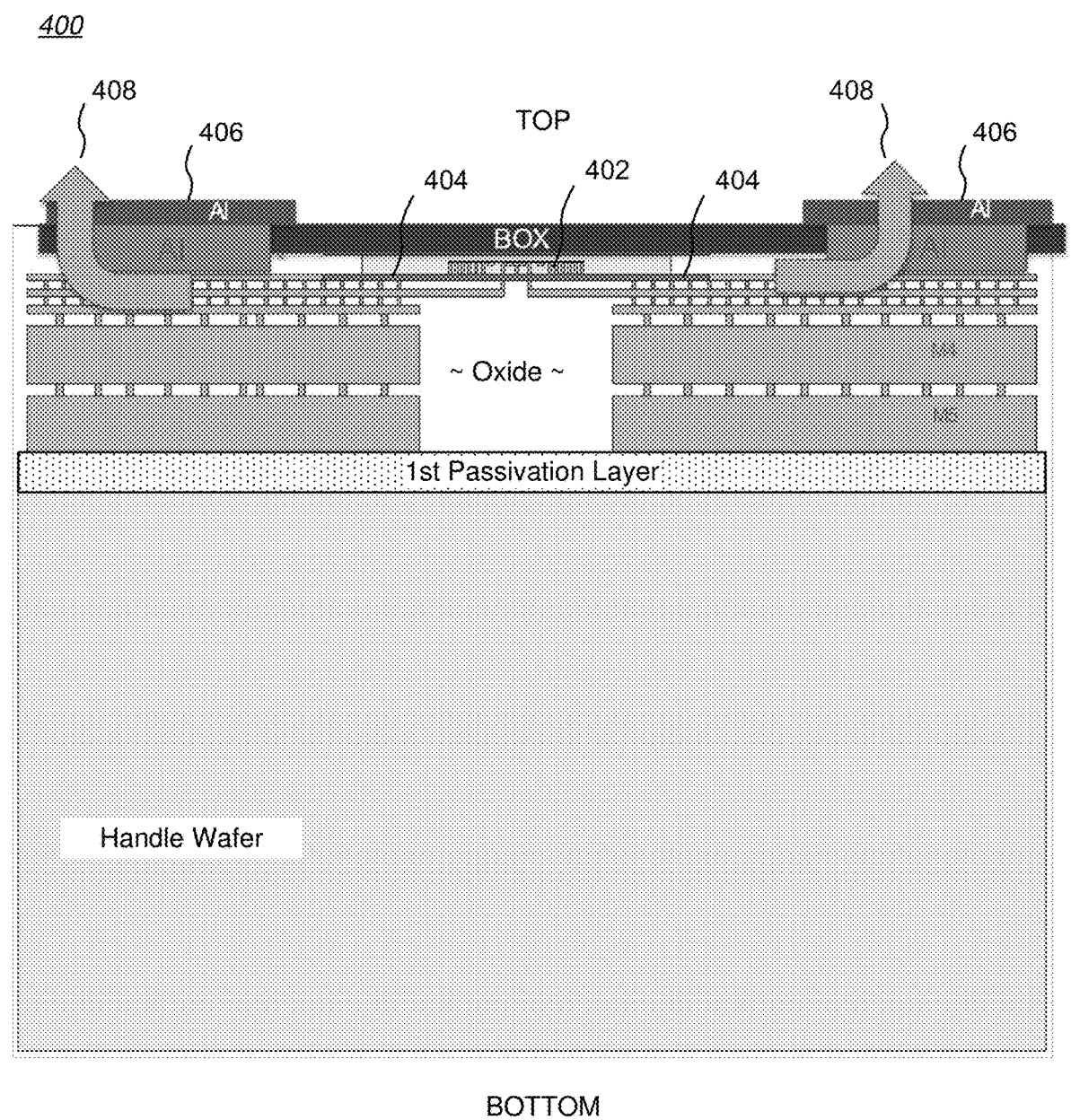
FIG. 4A is a stylized cross-sectional view of one embodiment of an SOI IC structure for a single FET made using a back-side access process and configured to conduct heat away from the FET to the "top" of the IC structure.

For example, FIG. 4A is a stylized cross-sectional view of one embodiment of an SOI IC structure 400 for a single FET 402 made using a back-side access process and configured to conduct heat away from the FET 402 to the "top" of the IC structure 400. In the illustrated example, the IC structure 400 is configured with electrically-isolated, laterally-extending thermal paths 404 formed adjacent the FET 402 and configured to conduct heat away from the FET 402 to externally accessible thermal pads 406. Arrows 408 show the direction of heat flow, initially laterally away from the FET 402 along the laterally-extending thermal paths 404, and then "upwards" to the "top" of the IC structure 400 to the externally accessible thermal pads 406. If desired, the FET 402 can be further processed to become a CAS-gated FET by adding the second passivation layer 206 and CAS gate "above" the BOX layer, as shown in FIGS. 3A and 3B (omitted from FIG. 4A for clarity).

Figure 4B:
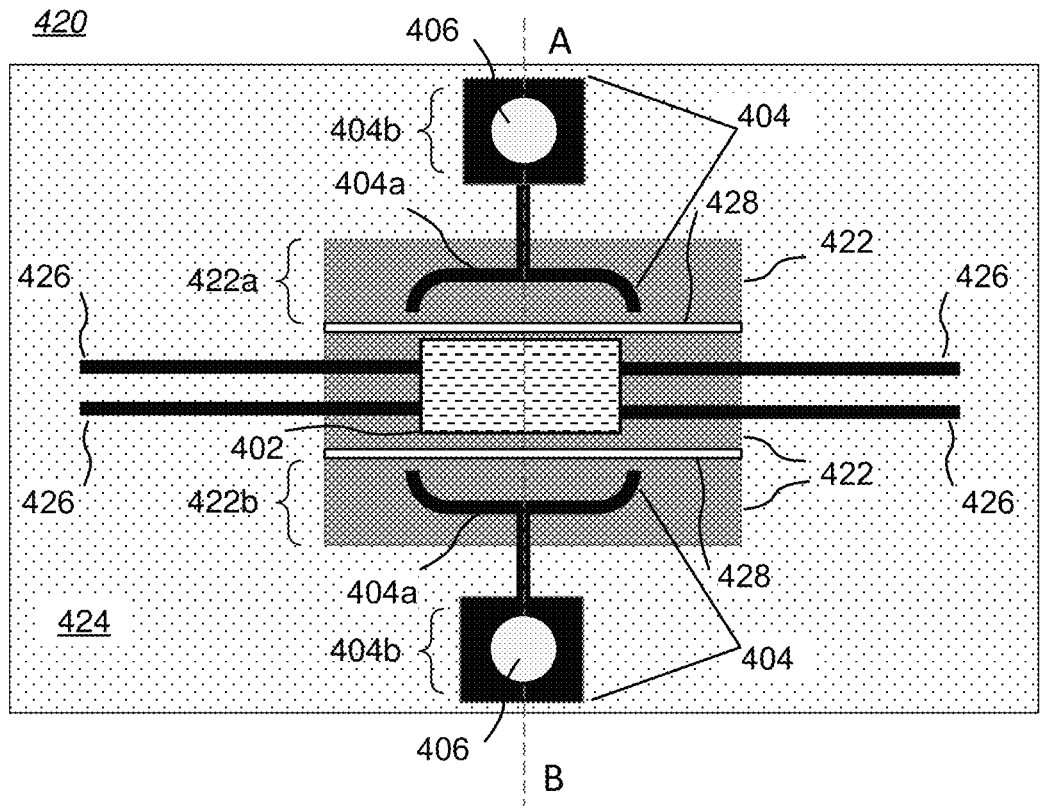
FIG. 4B is a top plan view of an SOI IC FET structure at an intermediate stage of fabrication, before applying an SLT process to "flip" the FET structure.
Figure 4C:
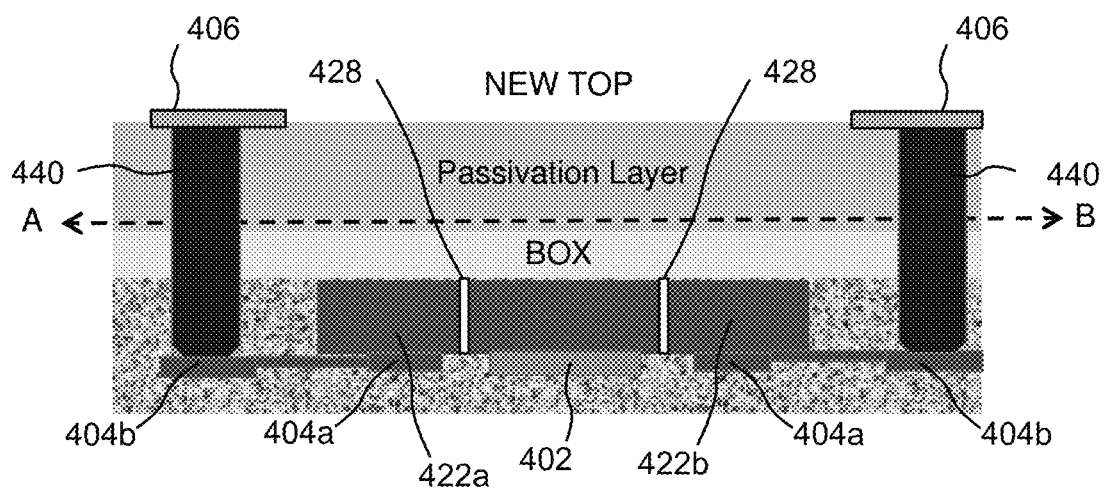
FIG. 4C is a cross-sectional view of the SOI IC FET structure of FIG. 4B at a later stage of fabrication, taken along dashed line A-B of FIG. 4B.

FIG. 4B is a top plan view of an SOI IC FET structure 420 at an intermediate stage of fabrication, before applying an SLT process to "flip" the FET structure 420. FIG. 4C is a cross-sectional view of the SOI IC FET structure 420 of FIG. 4B at a later stage of fabrication, taken along dashed line A-B of FIG. 4B. In this example, a silicon island 422 has been formed within a field oxide region 424. A silicide layer may be formed in a conventional manner on the exposed surface of the silicon island 422. Within the silicon island 422, a FET device 402 has been formed. In addition, the silicon island 422 is patterned to create electrically isolating structures 428 to electrically isolate the portion of the silicon island 422 containing the FET device 402 from edge portions 422a, 422b of the silicon island 422. Such electrically isolating structures 428 may be made, for example, using shallow trench isolation (STI), a known technique commonly used for preventing electric current leakage between adjacent semiconductor device components. One STI process involves etching a pattern of trenches in the silicon island 422, depositing one or more dielectric materials (such as silicon dioxide) to fill the trenches, and removing the excess dielectric using a technique such as chemical-mechanical planarization. However, other techniques may be used for forming the electrically isolating structures 428, such as local oxidation of the silicon regions between transistors (also known as LOCOS isolation).

During the formation of the first metallization connection layer (commonly called "metal 1" or "M1") for the IC FET structure 420, electrical connections 426 are made to the various terminals of the FET device 402 (e.g., source, drain, gate). In addition, in the illustrated example, the M1 layer—which is also thermally conductive and patterned over a first interlevel dielectric layer (ILD)—is patterned to form one or more electrically-isolated, laterally-extending thermal paths 404 each comprising (1) a near portion 404a in thermal contact, through the ILD, with the edge portion 422a, 422b adjacent the FET device 402, and (2) a far portion 404b spaced away from the edge portions 422a, 422b adjacent FET device 402 in a lateral direction (e.g., "horizontally" in FIG. 4C). The far portions 404b may be configured as heat release pads sufficiently large so as to enable good thermal contact with the externally accessible thermal pads 406 in FIG. 4A, the contact area ("footprint") of which is shown in FIG. 4B as circles. The near portions 404a should be sufficiently close to the FET device 402 so as to be able to thermally conduct a significant amount of heat away from the FET device 402. The far portions 404b should be sufficiently spaced away from the FET device 402 so that thermal connections can be made to those portions, as in FIG. 4C, without being blocked by or interfering with the FET device 402.

To be clear, heat generated by the FET device 402 (especially at its drain D) will flow laterally through the active region of the FET device 402, thence through the electrically isolating structures 428, and finally through edge portions 422a, 422b. After this lateral heat diffusion, the transistor-generated heat will diffuse vertically through the ILD layer situated between the edge regions 422a, 422b and the M1 layer, and thence into the near and far portions 404a, 404b of the electrically-isolated, laterally-extending thermal paths 404, respectively, that are patterned from the M1 layer. Since the M1 layer is an excellent heat conductor, the near portions 404a will conduct heat to the far portions 404b of the electrically-isolated, laterally-extending thermal paths 404, and ultimately on to an external heat sink (such as the thermal pads 406 in FIGS. 4A and 4C). Properly constructed, the near and far portions 404a, 404b of the electrically-isolated, laterally-extending thermal paths 404 will enable much lower thermal resistance from the FET device 402 to the thermal pads 406.

Thus, the purpose of the electrically-isolated, laterally-extending thermal paths 404 is to conduct heat away from the FET device 402 in a lateral direction when fabrication and SLT processing of the IC FET structure 420 is finished. Note that while FIG. 4B shows electrically-isolated, laterally-extending thermal paths 404 placed on two sides of the FET device 402, in some embodiments, one electrically-isolated, laterally-extending thermal path 404 may be sufficient (particularly on the drain D side of the FET device 402); such a configuration may also require less area on an IC. Note also that the material on which the M1 metallization layer is formed (e.g., a silicide) may be etched and backfilled with conductive material to form vias such that the M1 layer is in more direct thermal contact with the edge portions 422a, 422b of the silicon island 422.

In FIG. 4C, further steps of fabrication using the SLT process are shown. In particular, the IC FET structure 420 of FIG. 4B has been "flipped" over onto a handle wafer, as described above. Accordingly, the FET device 402 now faces "downward", away from the "new top" of the entire structure. The near portion 404a of the electrically-isolated, laterally-extending thermal paths 404 is positioned adjacent a respective edge region 422a, 422b and close to the FET device 402 (ideally, as close as possible under a set of applicable IC design rules). The far portion 404b of the electrically-isolated, laterally-extending thermal paths 404 extends laterally from the FET device 402 sufficient that generally orthogonal (e.g., "vertical") thermal pathways (e.g., vias or heat pipes) 440 of a thermally conductive material (e.g., copper or aluminum) can be fabricated through the Passivation Layer and the BOX layer to be in intimate thermal contact with the far portion 404b of the electrically-isolated, laterally-extending thermal paths 404. The generally orthogonal thermal pathways 440 may be formed, for example, by etching holes through the Passivation Layer and the BOX layer and filling the holes with the thermally conductive material, using known techniques. Note that some fabrication design rules for particular IC foundries may not allow use of a single large diameter orthogonal thermal pathway 440, and accordingly the single thermal pathways 440 illustrated in FIG. 4C may be replaced by multiple, smaller-diameter thermal pathways 440 (e.g., multiple vias).

Each generally orthogonal thermal pathway 440 may be capped by a thermal pad 406 made of a thermally conductive material. If the thermal pathways 440 are made of copper, then the material for the thermal pads 406 would generally be aluminum, to avoid oxidation of the copper. The thermal pads 406 may be fashioned as part of the RDL process for forming a CAS gate for the FET device 402. Of course, other heat conducting materials compatible with IC fabrication processes may be used for both the generally orthogonal thermal pathways 440 and the thermal pads 406.

Of note, using STI trenches for the electrically isolating structures 428 is particularly beneficial, since STI trenches can be made very narrow (e.g., about 200 nm, or 2000 Angstroms) and they run the entire width of the active transistor region (i.e., silicon island 422). Accordingly, the thermal resistance from the FET device 402 to the electrically-isolated, laterally-extending thermal paths 404 through STI trenches is much less than the thermal resistance through to either the top or the bottom of the completed SOI IC structure 400 (see FIG. 4A).

While using the M1 metallization layer to form the electrically-isolated, laterally-extending thermal paths 404 is quite convenient from a fabrication point of view, it is also possible to use other metallization layers (including custom layers) or to combine metallization layers. For example, one or more generally orthogonal thermal pathways may be formed in thermal contact with the electrically-isolated edge portions 422a, 422b of the silicon island 422 so as to be thermally coupled to the edge portions 422a, 422b. Such orthogonal thermal pathways may then be thermally coupled to lateral thermal paths formed from a metallization layer or layers other than M1. Other thermal pathways 440 and corresponding thermal pads 406 may then be thermally coupled to the lateral thermal paths, similar to FIG. 4C.

It should be understood that "electrically isolated", in the context of this disclosure, refers to substantially isolated from direct current flow. As a person of skill will understand, AC coupling through capacitor-like structures is inherent in conductor/insulator/conductor structures such as described above. Such AC coupling can be managed and mitigate by known design techniques.

Second Example Embodiment

In some embodiments of the invention that utilize a thermally-conductive handle wafer (e.g., silicon, metal, silicon carbide, diamond, etc.), during fabrication of a FET made using a back-side access process, one or more electrically-isolated thermal paths are formed adjacent a FET and configured to conduct heat laterally away from the FET. Thermal vias are formed sufficiently through (including all of the way through) the first passivation layer so as to be in thermal contact with the handle wafer and with the conventional metallization layers (such as M1-M5) of the device superstructure, at least one of which is in thermal contact with the lateral thermal paths. Accordingly, heat is conducted from the FET through the lateral thermal paths, then through the metallization layers and thermal vias to the thermally-conductive handle wafer, and thus to the "bottom" or "backside" of the completed integrated circuit (IC), which may be placed in thermal contact with a heat sink. Such a "bottom side" thermal extraction configuration may be used alone, but generally would be used in conjunction with the "top side" thermal extraction configuration described above to provide extra heat extraction from a FET device 402. A "bottom side" thermal extraction configuration is particularly useful for ICs mounted in a "wire bond" package.

Figure 5:
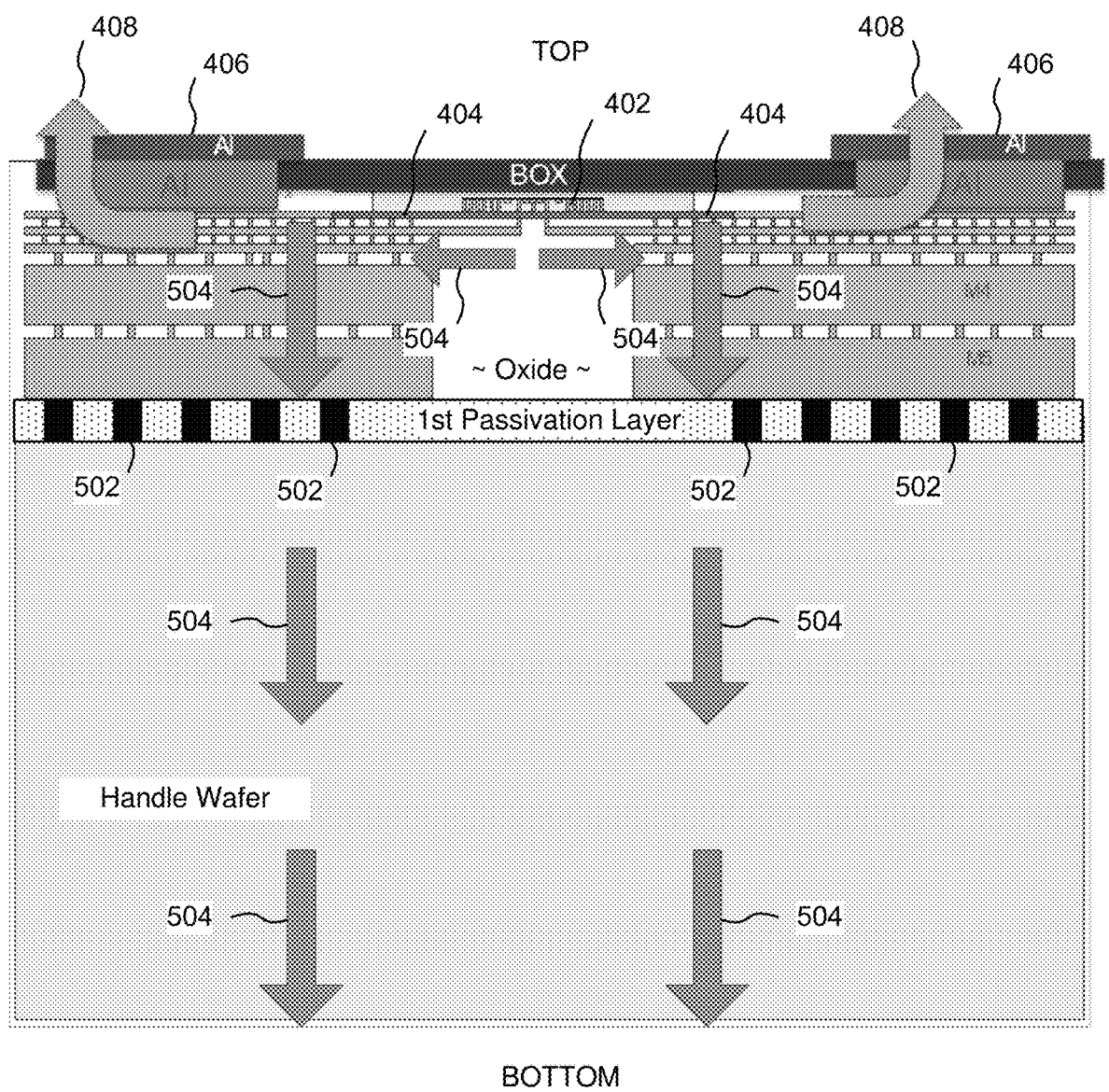
FIG. 5 is a stylized cross-sectional view of one embodiment of an SOI IC structure for a single FET made using a back-side access process and configured to conduct heat away from the FET to the "bottom" of the IC structure.

FIG. 5 is a stylized cross-sectional view of one embodiment of an SOI IC structure 500 for a single FET 402 made using a back-side access process and configured to conduct heat away from the FET 402 to the "bottom" of the IC structure 500, as depicted by heat flow arrows 504. The IC structure 500 is formed in essentially the same manner as the IC structure 400 of FIG. 4A, with an added element. As with the configuration shown in FIGS. 4A and 4B, during the formation of the M1 layer for the IC structure 500, electrical connections 426 are made to the various terminals of the FET device 402 (e.g., source, drain, gate). In addition, the thermally-conductive M1 layer is patterned to form one or more electrically-isolated, laterally-extending thermal paths 404 having a near portion (not separately labeled) in thermal contact with the FET device 402 and a far portion 404b (not separately labeled) spaced away from the FET device 402 in a lateral direction, in the manner described above.

The metallization layers can be patterned and interconnected, in known fashion, to provide lateral thermal pathways and vertical thermal pathways (e.g., "vertical" with respect to the plane of the FET device 402 in FIG. 5). In particular, vertical structures in the metallization layers (e.g., vias) can be formed to provide generally orthogonal, electrically-isolated, thermal pathways—"thermal vias"—from the metallization layer nearest the FET device 402 (i.e., M1 in this example, and thus including the electrically-isolated, laterally-extending thermal paths 404 of FIGS. 4B and 4C) to the layer nearest the handle wafer (i.e., M5 in this example). Patterning and interconnecting the metallization layers to create such thermal vias would be done as part of normal fabrications steps—that is, no additional fabrication steps would be required, only reconfiguration of the masks.

Using the M5 metallization layer as an example of the layer nearest the handle wafer after SLT processing, conventionally, the M5 layer would be separated from the handle wafer by the first passivation layer, as shown in FIG. 4A. However, in the embodiment shown in FIG. 5, one or more thermal vias 502 are formed sufficiently through the first passivation layer so as to be in thermal contact with the M5 layer and the handle wafer (only a few thermal vias 502 are labeled, to avoid clutter). The thermal vias 502 may be formed, for example, by etching holes through the first passivation layer and filling those holes with a thermal conductor (e.g., copper) before the single layer transfer process bonds the upper structure, containing the FET device 402, to the handle wafer. However, other conventional methods may be used to create the thermal vias 502. Since the handle wafer typically may be conductive or semiconductive, the thermal vias 502 generally should be electrically isolated from the electrical terminals for the FET device 402, similar to the isolation provided by the STI isolation regions 428 discussed above.

Arrows 504 show the direction of heat flow, initially laterally away from the FET 402 along the laterally-extending thermal paths 404, and then "downwards" to the "bottom" of the IC structure 500. If desired, the FET 402 can be further processed to become a CAS-gated FET by adding the second passivation layer 206 and CAS gate "above" the BOX layer, as shown in FIGS. 3A and 3B (omitted from FIG. 5 for clarity).

An advantage of the configuration shown in FIG. 5 is that the only added structures are the thermal vias 502, since the metallization layers for the thermal vias (i.e., generally orthogonal, electrically-isolated, thermal pathways) are formed as part of the normal fabrication process for the IC structure 500.

Third Example Embodiment

The embodiments shown in FIGS. 4A-4C and 5 utilize electrically isolating structures 428 (e.g., STI trenches) to electrically isolate the portion of a silicon island 422 containing a FET device 402 from edge portions 422a, 422b of the silicon island 422, and then using a metallization layer (typically the M1 layer) for electrically-isolated, laterally-extending thermal paths 404 from the edge portions 422a, 422b away from the FET device 402. However, these STI-like structures are quite large when compared to a typical MOS gate oxide, GOX, thickness, which may be less than 30 Ångstroms thick. Accordingly, in some embodiments, the electrically-isolated, laterally-extending thermal paths 404 may instead take advantage of one or more dummy gates each comprising a polysilicon gate-like structure formed on GOX over an extended active region (typically in the gate length, L, direction) and specially configured to conduct heat in the following sequence: laterally away from a FET along the extended active region; vertically through the thin (i.e., low thermal resistance) GOX; laterally along the dummy gates; vertically to regions of the M1 layer in contact with the dummy gate; and finally to generally orthogonal thermal pathways (e.g., vertical heat pipes and/or interconnection metallization structures) to external heat sinks (e.g., the externally accessible thermal pads 406 of FIG. 7B), thereby avoiding utilizing higher thermal resistance STI-like structures.

Figure 6A:
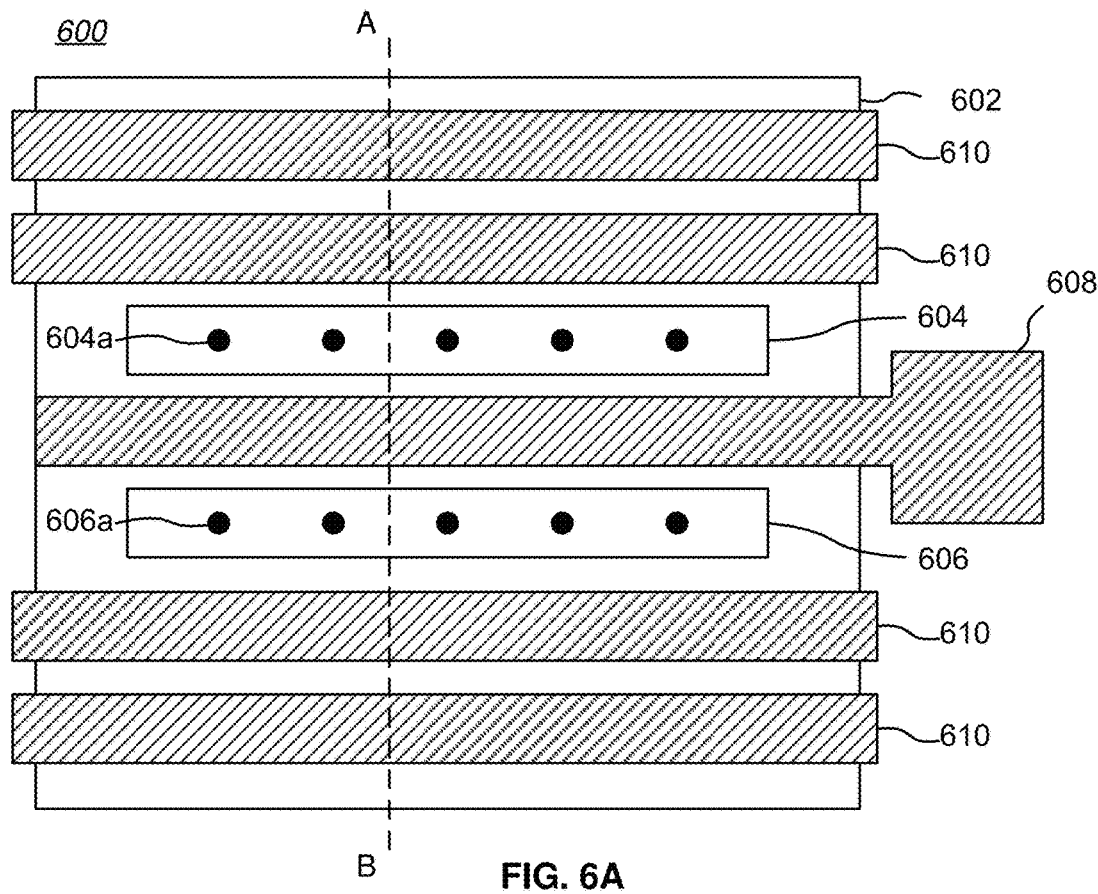
FIG. 6A is a top plan view of a conventional SOI IC FET structure at an intermediate stage of fabrication.
Figure 6B:
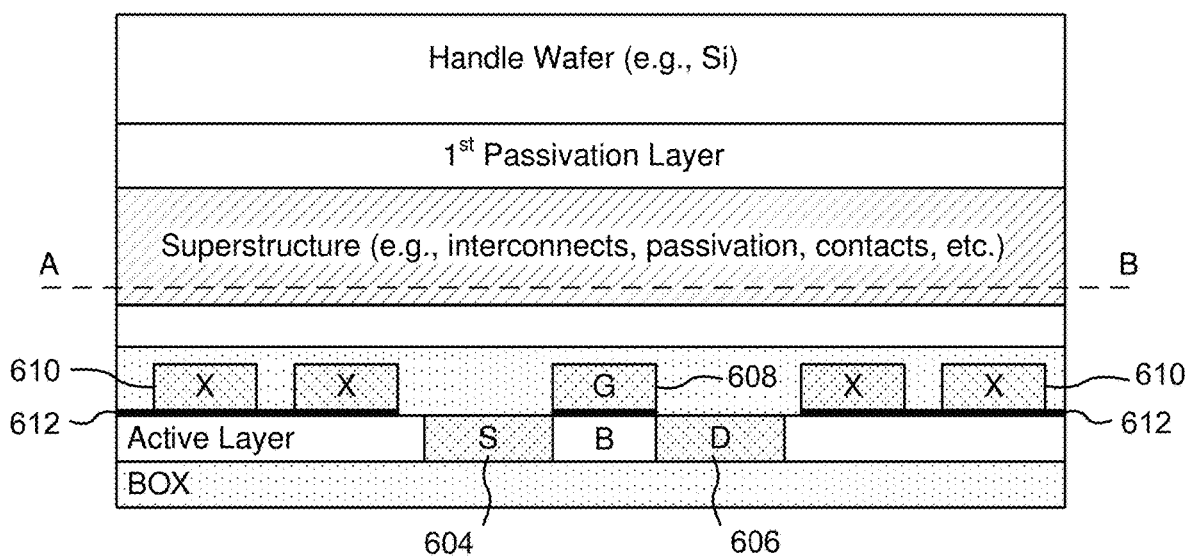
FIG. 6B is a cross-sectional view of the SOI IC FET structure of FIG. 6A at a later stage of fabrication, taken along line A-B of FIG. 6A.

FIG. 6A is a top plan view of a conventional SOI IC FET structure 600 at an intermediate stage of fabrication. FIG. 6B is a cross-sectional view of the SOI IC FET structure 600 of FIG. 6A at a later stage of fabrication, taken along line A-B of FIG. 6A. In the illustrated example, a silicon island 602 encompasses a FET comprising a source region underlying a metallization layer 604 with associated contacts 604a, and a drain region underlying a metallization layer 606 with associated contacts 606a. The source and drain regions are separated by a body B underlying and defined by a gate 608. The gate 608 is typically made of polysilicon overlying a gate oxide layer 612 grown on the silicon island 602. In some processes, dummy gates 610 ("X" elements in FIG. 6B) may be formed when the gate 608 is formed, and used for various purposes (e.g., electrical isolation, to meet particular design rule density constraints, etc.). Like the gate 608, the dummy gates 610 are generally made of polysilicon overlying the gate oxide 612 on the silicon island 602, typically with an over-layer of silicide, and extending beyond the edges of the silicon island 602. However, unlike the gate 608, the dummy gates 610 are not electrically connected, and they do not always have doped (e.g., N+) regions or silicide regions implanted in the active region separating adjacent dummy gates 610 (N+ and silicide regions are not shown in FIG. 6B).

In general, the main barrier to heat flow within IC FETs is the many different layers of $SiO_2$ or other insulating layers. As has been noted, the STI separation regions described above may be made quite narrow by lateral dimension standards, typically about 2000 Ångströms. However, one of the thinnest insulators in a FET, and therefore the lowest thermal resistance path (of the insulating layers in an IC FET) is through the gate oxide 612, with typical thicknesses of tens of Ångströms. Further, the gate material, typically polysilicon, is a relatively good thermal conductor. It was realized by the inventors that these characteristics could be adapted to provide lateral thermal paths to conduct heat away from a FET.

Figure 7A:
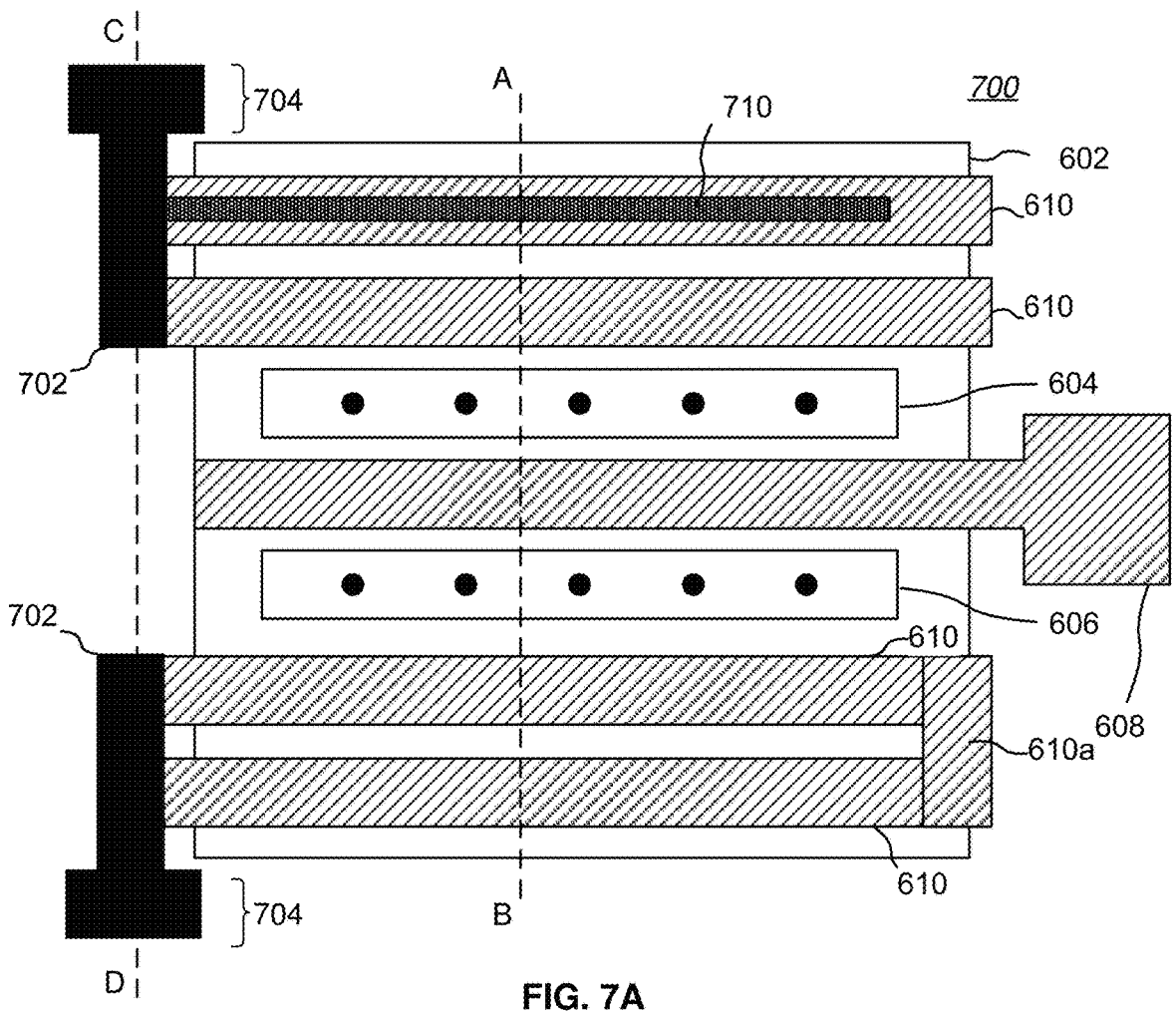
FIG. 7A is a top plan view of a SOI IC FET structure at an intermediate stage of fabrication, including thermally-coupled dummy gates.
Figure 7B:
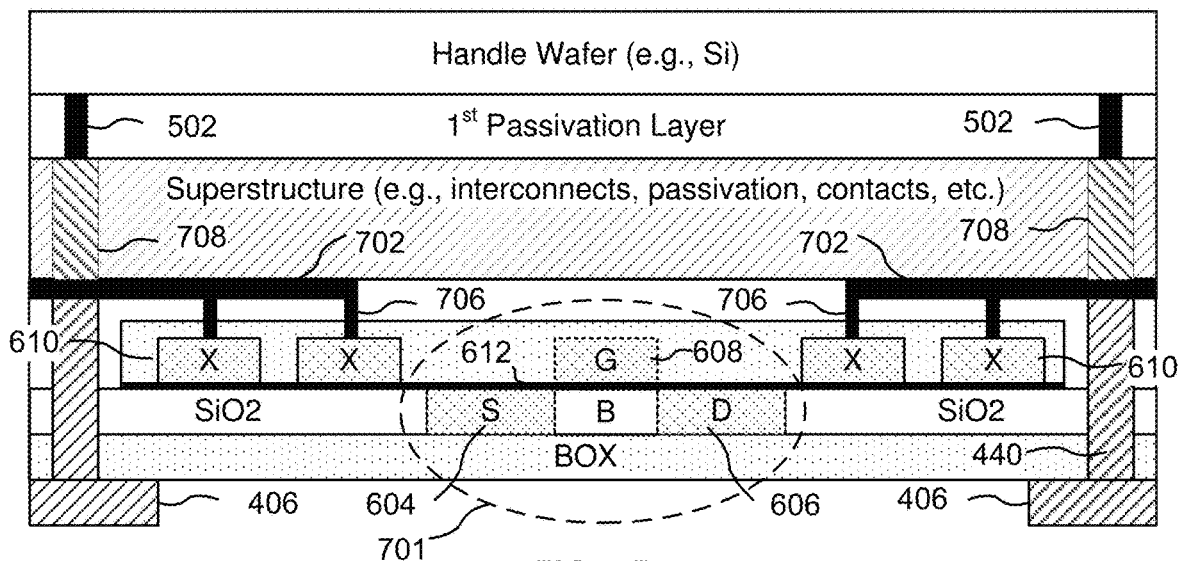
FIG. 7B is a "collapsed" cross-sectional view of the SOI IC FET structure of FIG. 7A after application of back-side access process, such as SLT.

As an example, FIG. 7A is a top plan view of a SOI IC FET structure 700 at an intermediate stage of fabrication, including thermally-coupled dummy gates 610. FIG. 7B is a "collapsed" cross-sectional view of the SOI IC FET structure 700 of FIG. 7A after application of back-side access process, such as SLT. More specifically, FIG. 7B is a cross-sectional view taken along both line C-D (for foreground features) and line A-B (for background features) of FIG. 7A. The transistor structure of FIG. 7A (i.e., from the cross-section taken through line A-B of FIG. 7A) is shown within oval 701 of FIG. 7B in dotted outline for reference. Other elements of FIG. 7B are from the cross-section though line C-D of FIG. 7A (line C-D does not cut through the transistor). In addition, the gate oxide 612 layer, while appearing to overlay the source S and drain D of the transistor, does not do so, but instead would be configured as in FIG. 6B near the transistor.

In the example illustrated in FIGS. 7A and 7B, one or more of the dummy gates 610 are formed so as to extend out beyond the edge of the silicon island 602. One or more of the dummy gates 610 are connected by one or more thermally conductive structures 702 that may extend to heat release pads 704. The thermally conductive structure 702 may be, for example, part of the M1 layer connected to the dummy gates 610 by thermally-conductive vias 706, as shown in FIG. 7B. Heat generated by the FET is conducted by the "near" (with respect to the FET) dummy gates 610 through the vias 706 to the thermally conductive structures 702 of the M1 layer, and thence laterally to "far" heat release pads 704.

As in the configuration of FIG. 4A, each heat release pad 704 may be thermally coupled to a generally orthogonal thermal pathway and thence to a thermal pad 406, for a "top side" thermal extraction configuration. Similarly, as in the configuration of FIG. 5, each heat release pad 704 may be thermally coupled to patterned and interconnected metallization layers 708 (such as M1-M5) of the device superstructure and thermal vias 502 to the handle wafer, for a "bottom side" thermal extraction configuration.

Heat from the FET to the heat release pads 704 thus flows through the entire area of the silicon island 602 that is covered by the dummy gates 610, passing through the extremely thin gate oxide material underneath the dummy gates 610. Compared to an embodiment that utilizes electrically-isolating STI trenches, the illustrated "trenchless" configuration reduces thermal resistance substantially (by as much as the ratio of the planar width of an STI trench to the thickness of a gate oxide), due to elimination of the series thermal resistance of the STI trench. An additional advantage of this embodiment is that the thermally conductive polysilicon dummy gates 610 are often thicker than the underlying silicon island 602, further reducing lateral thermal resistance.

While FIG. 7A shows two thermally conductive structures 702 and associated heat release pads 704 coupled to the pairs of dummy gates 610 at the left side of the illustrated silicon island 602, in some embodiments, one thermally conductive structure 702 and associated heat release pad 704 may be sufficient (particularly on the drain D side of the FET); such a configuration may also require less area on an IC. Since the dummy gates 610 extend past both the left and right sides of the illustrated silicon island 602, thermally conductive structures 702 and associated heat release pads 704 may be formed on both the left side (as shown) and right side (not shown) of the silicon island 602. Further, while the illustrated thermally conductive structures 702 and associated heat release pads 704 are shown coupled to pairs of dummy gates 610, in general, thermally conductive structures 702 and associated heat release pads 704 may be coupled to one or more dummy gates 610. In some embodiments, the illustrated groups (i.e., two or more per drain and/or source side of the FET) of dummy gates may be replaced with a single wide dummy gate (in effect, the dummy gate would thermally short out the active area).

In some embodiments, the connection of the thermally conductive structures 702 to the dummy gates 610 may be made at positions other than an end (i.e., along dashed line A-B through thermal vias to electrically isolated thermally conductive structures 702), and more than one thermally conductive structure 702 per "side" of the gate 608 may be used. One or more of the dummy gates 610 may be interconnected to one or more other dummy gates 610 by, for example, using polysilicon "straps" (such as strap 610a in FIG. 7A) to span two or more dummy gates 610 and thus increase the number of thermal pathways. One or more straps 610a can be formed at the ends of the dummy gates 610 or across the middle portions of the dummy gates 610. Such a configuration may better collect heat for conduction through the thermally conductive structures 702.

In a variation of the embodiment of FIG. 7A, extensions of the M1 layer of the thermally conductive structure 702 may be deposited over substantially the length of one or more dummy gates 610 and thermally coupled to those dummy gates 610 by thermally-conductive vias, similar to the vias 706 shown in FIG. 7B. For example, in FIG. 7A, one such extension 710 of the M1 layer is shown overlying the uppermost dummy gate 610; such a structure is often called a "strapped gate", meaning metal contacts the polysilicon over the active area. The M1 layer provides even better thermal conductivity than the polysilicon of the dummy gates 610, and accordingly such a configuration allows better control of heat.

Example Results

As should be appreciated from the above description, one aspect of the invention encompasses a thermal conduction structure for an integrated circuit transistor device made using a back-side access process and mounted on a handle wafer such that a gate of the transistor device is oriented towards the handle wafer, including: at least one laterally-extending thermal path (e.g., element 404 in FIGS. 4A-4C and 5, or elements 610, 702, 704 in FIGS. 7A-7B) having a near portion in close thermal contact with the transistor device, and a far portion sufficiently spaced away from the transistor device in a lateral direction from the transistor device so as to be couplable to a generally orthogonal thermal pathway, each thermal path being substantially electrically isolated from the transistor device; and at least one generally orthogonal thermal pathway thermally coupled to at least one thermal path and configured to convey heat from the at least one thermal path to at least one of (i) the at least one externally accessible thermal pad, or (ii) the handle wafer.

Finite element modeling of the configurations shown in FIG. 4A and FIG. 5 and in accordance with the laterally-extending thermal paths described above show significant improvement in heat extraction compared to a conventional SLT transistor. The analyses were made for a single FET with a power dissipation of about 0.8639 mW; the ambient condition was set at 25° C. Three separate scenarios were evaluated for four models. The scenarios for each model were: (1) the bottom side of the IC in contact with a 25° C. heat sink; (2) the top side of the IC in contact with a 25° C. heat sink; and (3) both the top side and the bottom side of the IC in contact with 25° C. heat sinks. The four models for each scenario were: (1) for comparison, temperatures of a FET made using a "baseline" conventional, non-SLT design; (2) for comparison, temperature differences for a FET made using a conventional SLT design; (3) temperature differences for a FET made using a "top side" thermal extraction configuration similar to the embodiment of FIG. 4A; and (4) temperature differences for a FET made using a "top side" thermal extraction configuration similar to the embodiment of FIG. 4A in conjunction with a "bottom side" thermal extraction configuration similar to the embodiment of FIG. 5. The results are shown in TABLE 1.

increase). However, use of a "top side" thermal extraction configuration in accordance with the present invention results in significant mitigation of FET temperature increases across all cooling scenarios. Lastly, use of a "top side" and "bottom side" thermal extraction configuration in accordance with the present invention results in a significant mitigation of FET temperature increases in the bottom cooling scenario, and actually reduces FET temperatures in the top cooling and combined top-and-bottom scenarios compared to a baseline non-SLT configuration.

Methods

Another aspect of the invention includes methods for making thermal conduction structures in accordance with the above teachings. For example, FIG. 8 is a process flow chart showing one method for making a thermal conduction structure a thermal conduction structure for an integrated circuit transistor device made using a back-side access process and mounted on a handle wafer such that a gate of the transistor device is oriented towards the handle wafer, including: fabricating at least one laterally-extending thermal path having a near portion in close thermal contact with the transistor device, and a far portion sufficiently spaced away from the transistor device in a lateral direction from the transistor device so as to be couplable to a generally orthogonal thermal pathway, each laterally-extending thermal path being substantially electrically isolated from the transistor device (STEP 802); and fabricating at least one generally orthogonal thermal pathway thermally coupled to at least one laterally-extending thermal path and configured to convey heat from the at least one laterally-extending thermal path to at least one of (i) the at least one externally accessible thermal pad, or (ii) the handle wafer (STEP 804).

Variants of the above method may include one or more of the following aspects: further including spacing at least one laterally-extending thermal path from the transistor device by an electrically isolating structure; further including spacing at least one laterally-extending thermal path from the transistor device by an electrically isolating structure formed by a shallow trench isolation process; further including fabricating at least one laterally-extending thermal path at least in part out of a metallization layer extending laterally from the transistor device; further including spacing the handle wafer from the transistor device by a passivation layer, and forming at least one thermal via through the passivation layer sufficiently so as to be thermally coupled to the handle wafer and to at least one generally orthogonal

TABLE 1

|  | Bottom Cooling | | Top Cooling | | Top & Bottom Cooling | |
| --- | --- | --- | --- | --- | --- | --- |
|  | (° C.) | Δ from non-SLT | (° C.) | Δ from non-SLT | (° C.) | Δ from non-SLT |
| Non-SLT | 6.3 | — | 8.2 | — | 6.0 | — |
| Conventional SLT | 14.8 | 135% | 14.4 | 76% | 13.7 | 128% |
| SLT with "top side" thermal extraction | 7.4 | 17% | 6.2 | −24% | 6.0 | 0% |
| SLT with "top side" & "bottom side" thermal extraction | 6.6 | 5% | 5.9 | −28% | 5.7 | −5% |

As the results in TABLE 1 indicate, a conventional SLT configuration exhibits significant temperature increases compared to a baseline non-SLT configuration, regardless of cooling scenario (additional modeling indicates that the problem is significantly exacerbated as device widths thermal pathway; further including fabricating at least one dummy gate electrically isolated from the transistor device by a gate oxide and in thermal contact with the transistor device, and fabricating at least one laterally-extending thermal path to be in thermal contact with at least one dummy gate; wherein the dummy gate comprises polysilicon; and/or further including fabricating at least one laterally-extending thermal path at least in part by fabricating at least one metallization layer overlaying at least one dummy gate and extending laterally from the transistor device.

Fabrication Technologies & Options

While the particular IC examples shown in FIGS. 4A-4C, 5, and 7A-7B do not show a CAS-gated FET, the thermal extraction structures described above are compatible with CAS-gated FETs as taught in co-pending U.S. patent application Ser. No. 15/920,321, entitled "Semiconductor-on-Insulator Transistor with Improved Breakdown Characteristics" and referenced above.

In addition, the teachings of present invention may be used in conjunction with the circuit designs and methods taught in the co-pending U.S. patent applications entitled "High-Q Integrated Circuit Inductor Structure and Methods" and "SLT Integrated Circuit Capacitor Structure and Methods", both referenced above.

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS processes enables circuits with low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Conclusion

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A method of making a thermal conduction structure for an integrated circuit transistor device, including:
   (a) fabricating at least one dummy gate electrically isolated from the transistor device by a gate oxide and in thermal contact with the transistor device;
   (b) fabricating at least one thermal path electrically isolated from the transistor device and in thermal contact with at least one dummy gate, the at least one thermal path configured to convey heat from the transistor device to a heat sink.

2. The method of claim 1, wherein the dummy gate comprises polysilicon.

3. The method of claim 1, further including fabricating at least one thermal path at least in part by fabricating at least one metallization layer overlaying at least a portion of at least one dummy gate and extending laterally from the transistor device.

4. The method of claim 1, wherein the integrated circuit transistor device is made using a silicon-on-insulator (SOI) process.

* * * * *